(12) United States Patent
Kim

(10) Patent No.: US 8,253,161 B2
(45) Date of Patent: Aug. 28, 2012

(54) LIGHT-EMITTING ELEMENT WITH IMPROVED LIGHT EXTRACTION EFFICIENCY, LIGHT-EMITTING DEVICE INCLUDING THE SAME, AND METHODS OF FABRICATING LIGHT-EMITTING ELEMENT AND LIGHT-EMITTING DEVICE

(75) Inventor: Yu-Sik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/096,445

(22) Filed: Apr. 28, 2011

(65) Prior Publication Data
US 2011/0198565 A1 Aug. 18, 2011

Related U.S. Application Data

(62) Division of application No. 12/462,803, filed on Aug. 10, 2009, now Pat. No. 7,968,356.

(30) Foreign Application Priority Data

Aug. 25, 2008 (KR) .................. 10-2008-0082992

(51) Int. Cl.
*H01L 33/00* (2010.01)
(52) U.S. Cl. .............. 257/99; 257/79; 257/98; 257/100; 257/E33.001
(58) Field of Classification Search ............. 257/98–100
See application file for complete search history.

(56) References Cited

U.S. PATENT DOCUMENTS

| | | | |
|---|---|---|---|
| 5,732,099 A | 3/1998 | Kawasumi et al. | |
| 6,320,209 B1 | 11/2001 | Hata et al. | |
| 6,936,851 B2 | 8/2005 | Wang | |
| 2003/0129779 A1 | 7/2003 | Akiyama | |
| 2005/0006636 A1 | 1/2005 | Shim et al. | |
| 2005/0029538 A1* | 2/2005 | Choi et al. ..................... | 257/103 |
| 2005/0069012 A1 | 3/2005 | Shimomura et al. | |
| 2005/0145862 A1 | 7/2005 | Kim et al. | |
| 2005/0145865 A1 | 7/2005 | Okuyama et al. | |
| 2005/0264172 A1 | 12/2005 | Wojnarowski et al. | |
| 2007/0200135 A1* | 8/2007 | Wang ............................ | 257/103 |
| 2009/0039362 A1 | 2/2009 | Han et al. | |
| 2009/0052083 A1 | 2/2009 | Nishikawa et al. | |
| 2010/0047944 A1 | 2/2010 | Kim | |

FOREIGN PATENT DOCUMENTS

| | | |
|---|---|---|
| JP | 6-302853 | 10/1994 |
| KR | 10-2005-0071238 | 7/2005 |

OTHER PUBLICATIONS

"Light-Emitting Element With Improved Light Extraction Efficiency, Light-Emitting Device Including the Same, and Methods of Fabricating Light-Emitting Element and Light-Emitting Device" Specification, Drawings and Prosecution History, of U.S. Appl. No. 12/462,803, filed Aug. 10, 2009, by Yu-Sik Kim.

* cited by examiner

*Primary Examiner* — Angel Roman
(74) *Attorney, Agent, or Firm* — Onello & Mello LLP

(57) ABSTRACT

Provided are a light-emitting element, a light-emitting device including the same, and methods of fabricating the light-emitting element and the light-emitting device. The light-emitting element includes a substrate on which a dome pattern is formed and a light-emitting structure conformally formed on the dome pattern. The light-emitting structure includes a first conductive layer of a first conductivity type, a light-emitting layer, and a second conductive layer of a second conductivity type sequentially stacked on the substrate. The light-emitting element also includes a first electrode formed on the first conductive layer and a second electrode formed on the second conductive layer.

9 Claims, 23 Drawing Sheets

LIGHT-EMITTING ELEMENT WITH IMPROVED LIGHT EXTRACTION EFFICIENCY, LIGHT-EMITTING DEVICE INCLUDING THE SAME, AND METHODS OF FABRICATING LIGHT-EMITTING ELEMENT AND LIGHT-EMITTING DEVICE

PRIORITY STATEMENT

This application is a divisional application of U.S. patent application Ser. No. 12/462,803, filed on Aug. 10, 2009, which claims the benefit of Korean Patent Application No. 10-2008-0082992, filed on Aug. 25, 2008 in the Korean Intellectual Property Office (KIPO), the contents of which applications are incorporated herein in their entirety by reference.

FIELD OF THE INVENTION

The present invention relates to a light-emitting element, a light-emitting device including the same, and methods of fabricating the light-emitting element and the light-emitting device.

BACKGROUND

A major challenge in the development of light-emitting elements is to improve light extraction efficiency. Light extraction efficiency denotes the proportion of light, which comes out of a light-emitting element (into, for example, air or transparent resin that surrounds the light-emitting element), in light generated within the light-emitting element. A light-emitting element may have an optical refractive index of approximately 2.2 to 3.8, air may have an optical refractive index of 1, and transparent resin may have an optical refractive index of approximately 1.5.

For example, when a light-emitting element has an optical refractive index of 3.4, a portion of light generated within the light-emitting element may come out of the light-emitting element into air at a critical angle of approximately 17 degrees and into transparent resin at a critical angle of approximately 26 degrees. That is, light, which is almost perpendicular to a surface of a light-emitting element from among light generated within the light-emitting element, can come out of the light-emitting element.

In this case, the light extraction efficiency of the light-emitting element is approximately 2.2% when a portion of light generated within the light-emitting element comes out of the light-emitting element into air, and the light extraction efficiency of the light-emitting element is approximately 4% when the portion of the light generated within the light-emitting element comes out of the light-emitting element into transparent resin. The other portion of the light is reflected by the surface of the light-emitting element and trapped in the light-emitting element.

SUMMARY OF THE INVENTION

According to various aspects of the present invention provided are a light-emitting element and a light-emitting device with improved light extraction efficiency. Aspects of the present invention also provide methods of fabricating a light-emitting element and a light-emitting device with improved light extraction efficiency. However, aspects of the present invention are not restricted to those set forth herein.

According to an aspect of the present invention, there is provided a light-emitting element including: a substrate on which a dome pattern is formed; a light-emitting structure conformally formed on the dome pattern. The light-emitting structure includes a first conductive layer of a first conductivity type, a light-emitting layer, and a second conductive layer of a second conductivity type sequentially stacked. A first electrode formed on a protrusion of the first conductive layer and a second electrode is formed on the second conductive layer.

The dome pattern can be a convex dome pattern.

The dome pattern can be a concave dome pattern.

The light-emitting element can further include a reflective layer formed on the second conductive layer.

According to another aspect of the present invention, there is provided a light-emitting element including: a substrate; a light-emitting structure that includes a first conductive layer of a first conductivity type, a light-emitting layer, and a second conductive layer of a second conductivity type sequentially stacked on the substrate; a first electrode or an ohmic layer electrically connected to the first conductive layer; and a second electrode electrically connected to the second conductive layer. The light-emitting structure is arched-shaped and a vacant space is formed between the light-emitting structure and the substrate.

The substrate can be a conductive substrate, and the first electrode or the ohmic layer can be disposed between the conductive substrate and the light-emitting structure.

The first electrode or the ohmic layer can be conformally formed on the light-emitting structure.

The light-emitting element can further comprise an adhesive material layer containing a metal material and disposed between the first electrode and the substrate.

According to another aspect of the present invention, provided is a light-emitting device comprising a light-emitting element. The light-emitting element includes a substrate; an arch-shaped light-emitting structure conformally formed on the substrate and comprising a first conductive layer of a first conductivity type, a light-emitting layer, and a second conductive layer of a second conductivity type sequentially stacked; a first electrode electrically connected to the first conductive layer; and a second electrode electrically connected to the second conductive layer.

According to another aspect of the present invention, there is provided a method of fabricating a light-emitting element. The method includes: forming a dome pattern on a substrate; conformally forming a light-emitting structure, including sequentially stacking a first conductive layer of a first conductivity type, a light-emitting layer, and a second conductive layer of a second conductivity type on the dome pattern; and forming a first electrode on a protrusion portion of the first conductive layer and forming a second electrode on the second conductive layer.

The dome pattern can be a convex dome pattern.

Forming the dome pattern on the substrate can include forming a mask pattern, which is shaped like a convex dome, on the substrate and etching the substrate using the mask pattern.

The dome pattern can be a concave dome pattern.

Forming the dome pattern on the substrate can include: forming a mask layer on the substrate; forming a concave dome pattern in the mask layer using a tool having a convex dome pattern and etching the substrate using the mask layer having the concave dome pattern.

Forming the concave dome pattern in the mask layer can include: pressing the mask layer with the tool having the convex dome pattern and separating the tool having the convex dome pattern from the mask layer.

The method can further comprise forming a reflective layer on the second conductive layer.

According to another aspect of the present invention, there is provided a method of fabricating a light-emitting element. The method includes: forming a light-emitting structure, including sequentially stacking a first conductive layer of a first conductivity type, a light-emitting layer, and a second conductive layer of a second conductivity type on a substrate, the light-emitting structure being arched-shaped, and a vacant space being formed between the light-emitting structure and the substrate; forming a first electrode or an ohmic layer and electrically connecting the first electrode or ohmic layer to the first conductive layer; and forming a second electrode and electrically connecting the second electrode to the second conductive layer.

According to another aspect of the present invention, there is provided a method of fabricating a light-emitting element. The method includes forming a concave dome pattern on a first substrate and conformally forming a light-emitting structure, including sequentially stacking a first conductive layer of a first conductivity type, a light-emitting layer, and a second conductive layer of a second conductivity type on the concave dome pattern on the first substrate. The method also includes forming a second electrode or an ohmic layer on the light-emitting structure and electrically connecting the first electrode or ohmic contact layer to the second conductive layer. The method further includes bonding the first substrate to a second substrate so that the second electrode or the ohmic layer is disposed between the first and second substrates, removing the first substrate, and forming a first electrode on the first conductive layer after removing the first substrate.

The second substrate can be a conductive substrate that is larger than the first substrate.

The first substrate can be adhesively bonded to the second substrate.

Forming the concave dome pattern on the first substrate can include forming a mask layer on the first substrate, forming a concave dome pattern in the mask layer by using a tool having a convex dome pattern, and etching the first substrate by using the mask layer having the concave dome pattern.

Forming the concave dome pattern in the mask layer by using the tool having the convex dome pattern can include pressing the mask layer with the tool having the convex dome pattern and separating the tool having the convex dome pattern from the mask layer.

In accordance with another aspect of the invention, provided is a method of fabricating a light-emitting device having a light-emitting element. The method includes: forming a substrate; conformally forming an arch-shaped light-emitting structure on the substrate, including sequentially stacking a first conductive layer of a first conductivity type, a light-emitting layer, and a second conductive layer of a second conductivity type on the substrate; forming a first electrode and electrically connecting the first electrode to the first conductive layer; and forming a second electrode and electrically connecting the second electrode to the second conductive layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION

Figure 1:
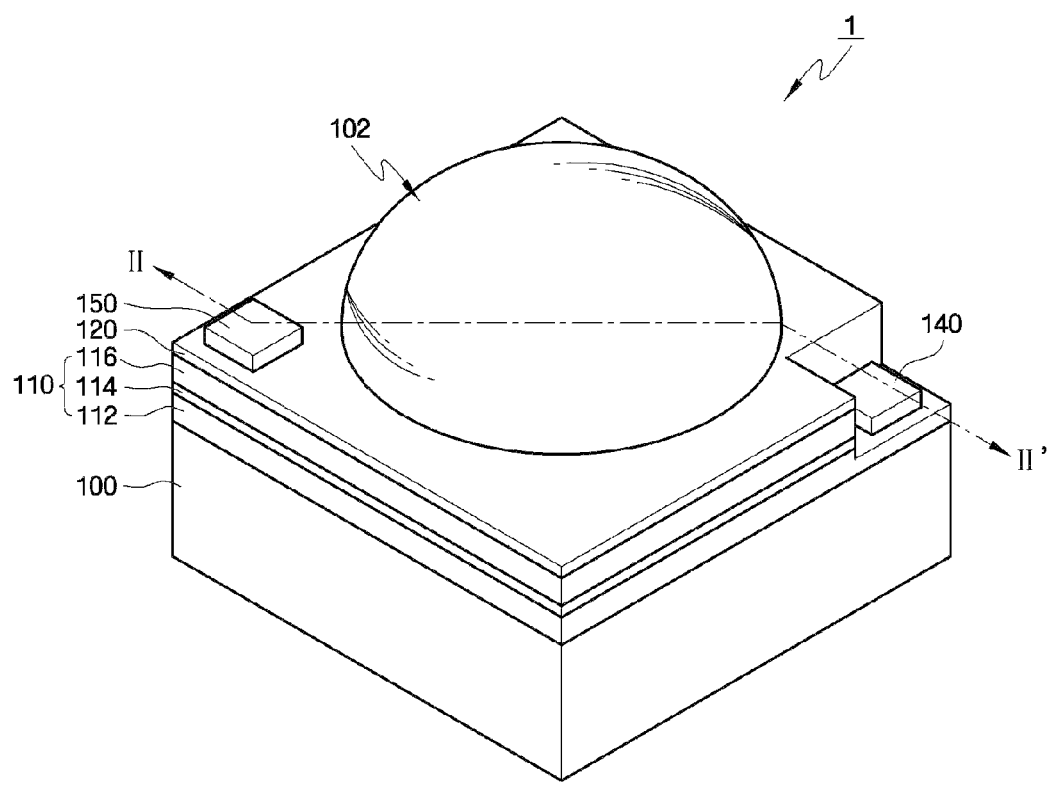
FIG. 1 is a perspective view of a first exemplary embodiment of a light-emitting element according to aspects of the present invention.

Advantages and features in accordance with aspects of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Like reference numerals refer to like elements throughout the specification. In the drawings, the size and relative size of the layers and regions are exaggerated for clarity.

It will be understood that when an element or layer is referred to as being "on" another element or layer, the element or layer can be directly on another element or layer or intervening elements or layers may be present. In contrast, when an element or layer is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe the relationship of one element or component to another element(s) or component(s) as illustrated in the figures. It will be understood that the spatially relative terms are intended to encompass different orientations of the device in use or operation, in addition to the orientation depicted in the figures. Throughout the specification, like reference numerals in the drawings denote like elements, and thus their description will be omitted.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments in accordance with the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of an element and are not intended to limit the scope of the invention.

Figure 2:
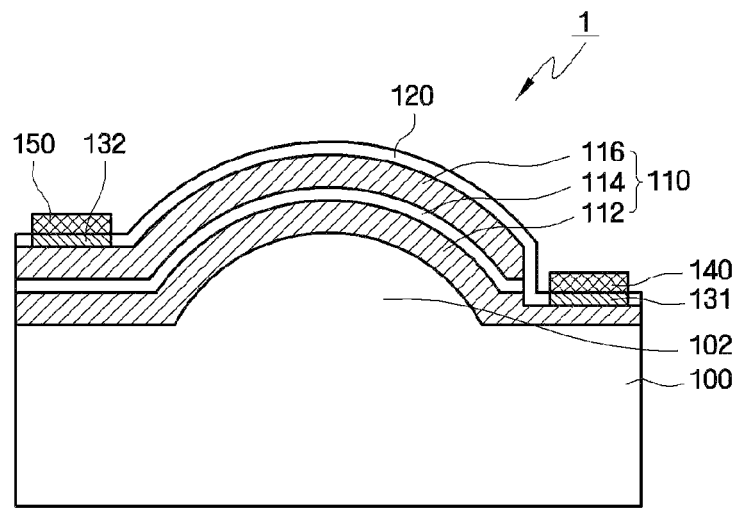
FIG. 2 is a cross-sectional view of the light-emitting element of FIG. 1 taken along the line II-II'.
Figure 3:
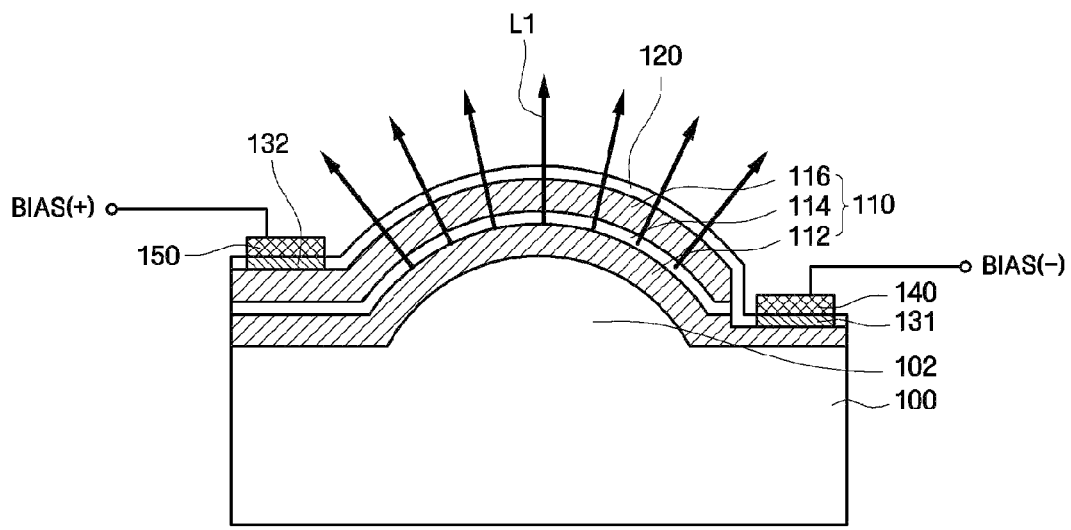
FIG. 3 is a view for explaining the operation of the light-emitting element according to the first exemplary embodiment of FIG. 1.

FIGS. 1 through 3 are views for explaining a light-emitting element 1 according to aspects of the present invention. Specifically, FIG. 1 is a perspective view of a first exemplary embodiment of a light-emitting element 1 according to aspects of the present invention. FIG. 2 is a cross-sectional view of the light-emitting element 1 of FIG. 1 taken along the line FIG. 3 is a view for explaining a first exemplary embodiment of the operation of the light-emitting element 1 according to aspects of the present invention. The light-emitting element 1 according to the first exemplary embodiment is of a lateral type.

Referring to FIGS. 1 and 2, the light-emitting element 1 according to the first exemplary embodiment includes a substrate 100 on which a dome pattern 102 is formed and a light-emitting structure 110 conformally formed along the dome pattern 102. The light-emitting structure 110 includes a first conductive layer 112 of a first conductivity type, a light-emitting layer 114, and a second conductive layer 116 of a second conductivity type, which are sequentially stacked. A first electrode 140 is electrically connected to the first conductive layer 112, and a second electrode 150 is electrically connected to the second conductive layer 116.

Specifically, as shown in the drawings, the dome pattern 102 may be shaped like a convex dome. However, the shape of the dome pattern 102 is not limited thereto. In addition, as shown in the drawings, only one dome pattern 102 may be formed on the substrate 100. However, the present invention is not limited thereto.

The dome pattern 102 may have a width of 100 to 1,000 µm. For example, the dome pattern 102 may have a width of 300 µm, which is approximately the size of a small integrated circuit or chip.

The light-emitting structure 110 includes the first conductive layer 112 of the first conductivity type, the light-emitting layer 114, and the second conductive layer 116 of the second conductivity type stacked sequentially.

Each of the first conductive layer 112, the light-emitting layer 114, and the second conductive layer 116 may include $In_xAl_yGa_{(1-x-y)}N$ ($0 \leq x \leq 1$, $0 \leq y \leq 1$) (i.e., various materials containing GaN). For example, each of the first conductive layer 112, the light-emitting layer 114, and the second conductive layer 116 may be AlGaN or InGaN.

Specifically, the first conductive layer 112 may be of the first conductivity type (e.g., an n type), and the second conductive layer 116 may be of the second conductivity type (e.g., a p type). Conversely, the first conductive layer 112 may be of the second conductivity type (the p type), and the second conductive layer 116 may be of the first conductivity type (the n type), depending on the designing way of the light-emitting element 1.

The light-emitting layer 114 is a region where light is generated when carriers (e.g., electrons) of the first conductive layer 112 combine with carriers (e.g., holes) of the second conductive layer 116. Although not specifically shown in the drawings, the light-emitting layer 114 may include a well layer and a barrier layer. Since the well layer has a smaller band gap than the barrier layer, the carriers (electrons and holes) gather in the well layer and combine together. The light-emitting layer 114 may have a single quantum well (SQW) structure or a multiple quantum well (MQW) structure, as examples, depending on the number of well layers included in the light-emitting layer 114. The SQW structure includes only one well layer while the MQW structure includes a plurality of well layers. In order to control light-emitting properties, at least one of the well layer and the barrier layer may be doped with at least one of boron (B), phosphorous (P), silicon (Si), magnesium (Mg), zinc (Zn), selenium (Se), and aluminum (Al).

In particular, in the light-emitting element 1 according to the first exemplary embodiment, the light-emitting structure 110 is conformally formed along the dome pattern 102 described above. In other words, the light-emitting structure 110 may be arch-shaped when viewing it from a cross-section. Thus, light generated within the light-emitting structure 110 can easily come out of the light-emitting structure 110 without being trapped in the light-emitting structure 110. Consequently, the light extraction efficiency of the light-emitting element 1 is improved.

Specifically, when a material used for the light-emitting structure 110 is $In_xAl_yGa_{(1-x-y)}N$ ($0 \leq x \leq 1$, $0 \leq y \leq 1$), the light-emitting structure 110 may have an optical refractive index of approximately 2.2 to 3.8. In addition, air may have an optical refractive index of 1, and transparent resin may have an optical refractive index of approximately 1.5. When the optical refractive index of the light-emitting element 1 is 3.4, a portion of light generated within the light-emitting structure 110 may come out of the light-emitting structure 110 into air at a critical angle of approximately 17 degrees and into transparent resin at a critical angle of approximately 26 degrees. That is, light, which is almost perpendicular to a surface of the light-emitting structure 110 from among light generated within the light-emitting structure 110, can come out of the light-emitting structure 110.

When the light-emitting structure 110 is conformally formed along the dome pattern 102 and thus curved as in the first exemplary embodiment, a large portion of light generated within the light-emitting structure 110 is almost perpendicular to the surface of the light-emitting structure 110. Thus, most of the light generated within the light-emitting structure 110 can come out of the light-emitting structure 110. Even when light is reflected by the surface of the light-emitting structure 110, it is not trapped forever in the light-emitting structure 110. Instead, the light is highly likely to come out of the light-emitting structure 110 after being reflected a number of times within the light-emitting structure 110, which is conformally formed along the dome pattern 102.

Although not shown in the drawings, a surface of the second conductive layer 116 may be textured. When the surface of the second conductive layer 116 is textured, more light can come out of the light-emitting structure 110, thereby improving light extraction efficiency.

As shown in FIG. 1, the first conductive layer 112 may have a protruding portion, that is, the first conductive layer 112 may extend further than the second conductive layer 116 and/or the light-emitting layer 114.

An insulating layer 120 is conformally formed on the light-emitting structure 110 and patterned to expose a portion of the first conductive layer 112 and a portion of the second conductive layer 116. The insulating layer 120 may include a silicon oxide film, a silicon nitride film, an aluminum oxide film, or an aluminum nitride film, as examples. The insulating layer 120 may be formed by plasma enhanced chemical vapor deposition (PECVD), thermal oxidation, electron-beam evaporation, sputtering, or the like.

A first ohmic layer 131 and the first electrode 140 may be formed on the portion of the first conductive layer 112 exposed by the insulating layer 120, and a second ohmic layer 132 and the second electrode 150 may be formed on the portion of the second conductive layer 116 exposed by the insulating layer 120. Each of the first and second ohmic layers 131 and 132 may include at least one of indium tin oxide (ITO), Zn, zinc oxide (ZnO), silver (Ag), tin (Ti), Al, aurum (Au), nickel (Ni), indium oxide ($In_2O_3$), tin oxide ($SnO_2$), copper (Cu), tungsten (W), and platinum (Pt), as examples. In addition, each of the first and second electrodes 140 and 150 may include at least one of ITO, Cu, Ni, chrome (Cr), Au, titanium (Ti), Pt, Al, vanadium (V), W, molybdenum (Mo), and Ag, as examples.

The substrate 100 may be made of any material from which the first conductive layer 112, the light-emitting layer 114, and the second conductive layer 116 can grow. For example, the substrate 100 may be an insulating substrate made of sapphire ($Al_2O_3$) or ZnO or may be a conductive substrate made of Si or silicon carbide (SiC).

Although not shown in the drawings, a buffer layer may be formed between the substrate 100 and the first conductive layer 112. The buffer layer can serve as a seed layer from which the first conductive layer 112 can grow. Therefore, the buffer layer may be made of any material that can make the buffer layer serve as a seed layer. For example, the buffer layer may be made of $In_xAl_yGa_{(1-x-y)}N$ ($0 \leq x \leq 1, 0 \leq y \leq 1$) or $Si_xC_yN_{(1-x-y)}$ ($0 \leq x \leq 1, 0 \leq y \leq 1$), as examples.

The operation of the light-emitting element 1 according to the first exemplary embodiment will now be described with reference to FIG. 3. Referring to FIG. 3, when the first conductive layer 112 is of the n type and when the second conductive layer 116 is of the p type, a first bias BIAS(−) is applied to the first conductive layer 112 via the first electrode 140 and the first ohmic layer 131, and a second bias BIAS(+) is applied to the second conductive layer 116 via the second electrode 150 and the second ohmic layer 132. Conversely, when the first conductive layer 112 is of the p type and when the second conductive layer 116 is of the n type, the second bias BIAS(+) is applied to the first conductive layer 112 via the first electrode 140 and the first ohmic layer 131, and the first bias BIAS(−) is applied to the second conductive layer 116 via the second electrode 150 and the second ohmic layer 132.

Thus, the light-emitting structure 110 is forward-biased. The forward bias causes the light-emitting layer 114 to generate light L1. Since the light-emitting structure 110 is conformally formed along the dome pattern 102, a large portion of the light L1 generated within the light-emitting structure 110 may be almost perpendicular to the surface of the light-emitting structure 110. Thus, most of the light L1 generated within the light-emitting structure 110 can come out of the light-emitting structure 110, thereby improving light extraction efficiency.

Figure 4:
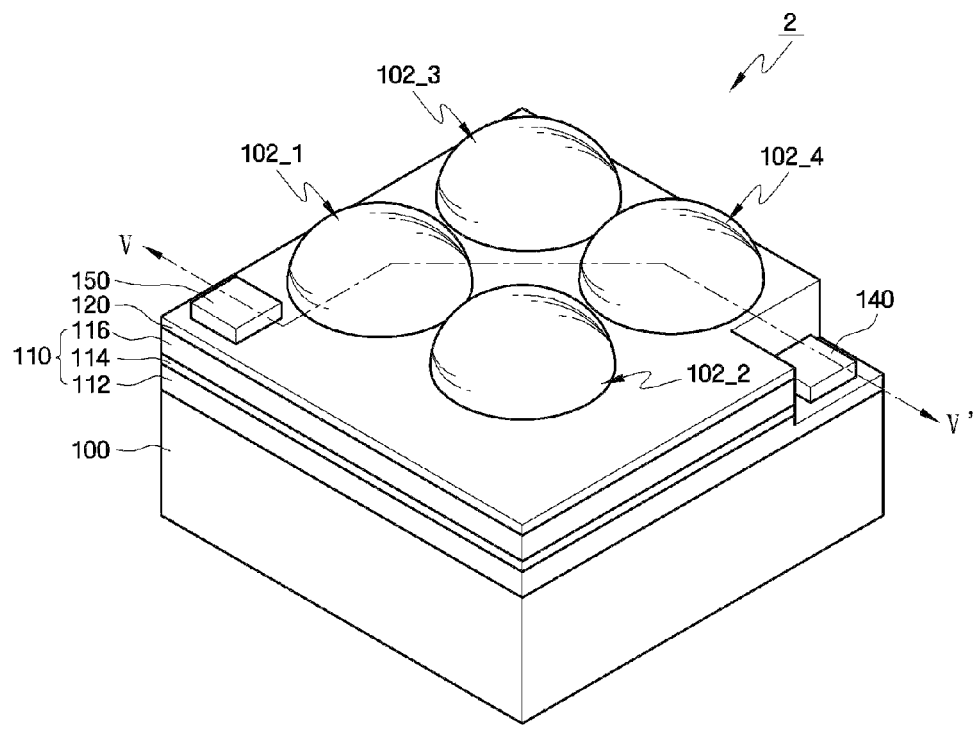
FIG. 4 is a perspective view of a second exemplary embodiment of a light-emitting element according to aspects of the present invention.
Figure 5:
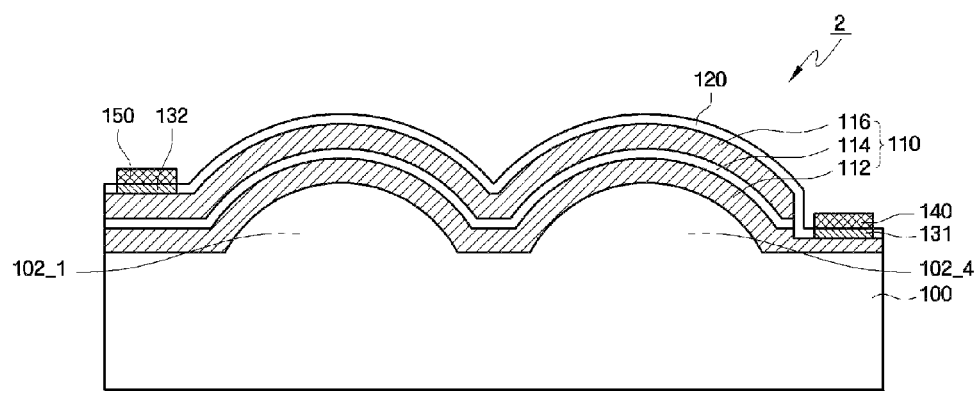
FIG. 5 is a cross-sectional view of the light-emitting element of FIG. 4 taken along the line V-V'.

FIGS. 4 and 5 are views for explaining a second exemplary embodiment of a light-emitting element 2 according to aspects of the present invention. Specifically, FIG. 4 is a perspective view of the light-emitting element 2 according to the second exemplary embodiment. FIG. 5 is a cross-sectional view of the light-emitting element 2 taken along the line V-V' of FIG. 4.

Referring to FIGS. 4 and 5, the light-emitting element 2 according to the second exemplary embodiment is different from the light-emitting element 1 according to the first exemplary embodiment in that it includes a plurality of dome patterns 102_1 through 102_4. The four dome patterns 102_1 through 102_4 (arranged in a 2×2 matrix) are shown as a mere example. That is, two or more dome patterns 102_1 through 102_n (n≥2) may be formed in other embodiments and in other arrangements. A light-emitting structure 110 is conformally formed along the dome patterns 102_1 through 102_4. Light-emitting structure 110 is the same as that shown in FIGS. 1-3 and described above. This will be evident from the cross-sectional view of FIG. 5. Therefore, the description of light-emitting structure 110 is not repeated here.

Figure 6:
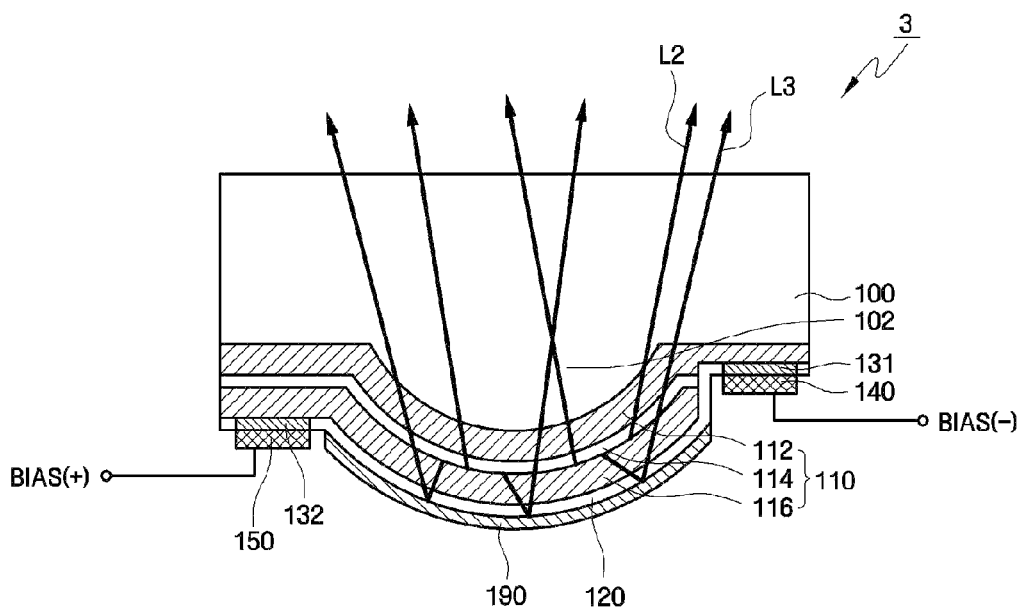
FIG. 6 is a view for explaining a third exemplary embodiment of a light-emitting element according to aspects of the present invention.

FIG. 6 is a view for explaining a third exemplary embodiment of a light-emitting element 3 according to aspects of the present invention. Referring to FIG. 6, the light-emitting element 3 according to the third exemplary embodiment is of a flip-chip type.

The light-emitting element 3 according to the third exemplary embodiment is different from the light-emitting element 1 according to the first exemplary embodiment in that it further includes a reflective layer 190 that is conformally formed above a second conductive layer 116. The reflective layer 190 may be made of a material having high reflectivity. For example, the reflective layer 190 may be made of Ag or Al. From among light L2 and L3 generated within a light-emitting structure 110, the light L2 comes directly out of the light-emitting structure 110 toward a substrate 100, and the light L3 is reflected by the reflective layer 190 and then comes out of the light-emitting structure 110 toward the substrate 100. In this way, the reflective layer 190 formed above the second conductive layer 116 can improve the light extraction efficiency of the flip chip-type light-emitting element 3.

In FIG. 6, an insulating layer 120 is formed on the second conductive layer 116, and the reflective layer 190 is formed on the insulating layer 190. However, the present invention is not limited to this arrangement. For example, the second conductive layer 116 may be formed directly on the reflective layer 190 without having the insulating layer 120 interposed between the two.

Figure 7:
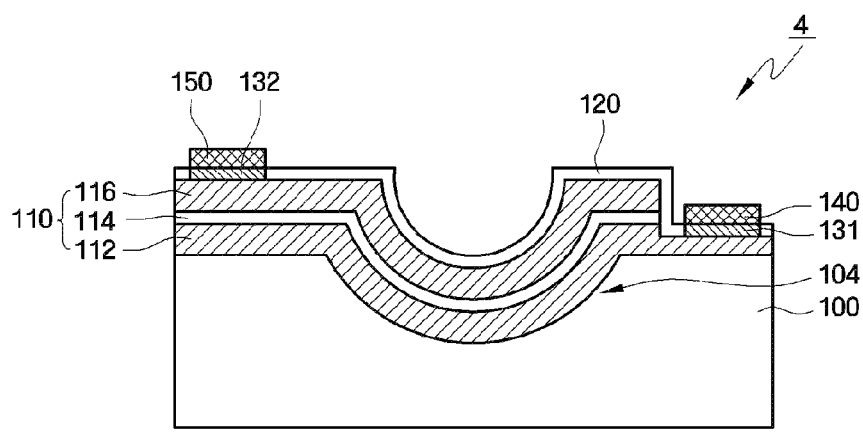
FIG. 7 is a view for explaining a fourth exemplary embodiment of a light-emitting element according to aspects of the present invention.
Figure 8:
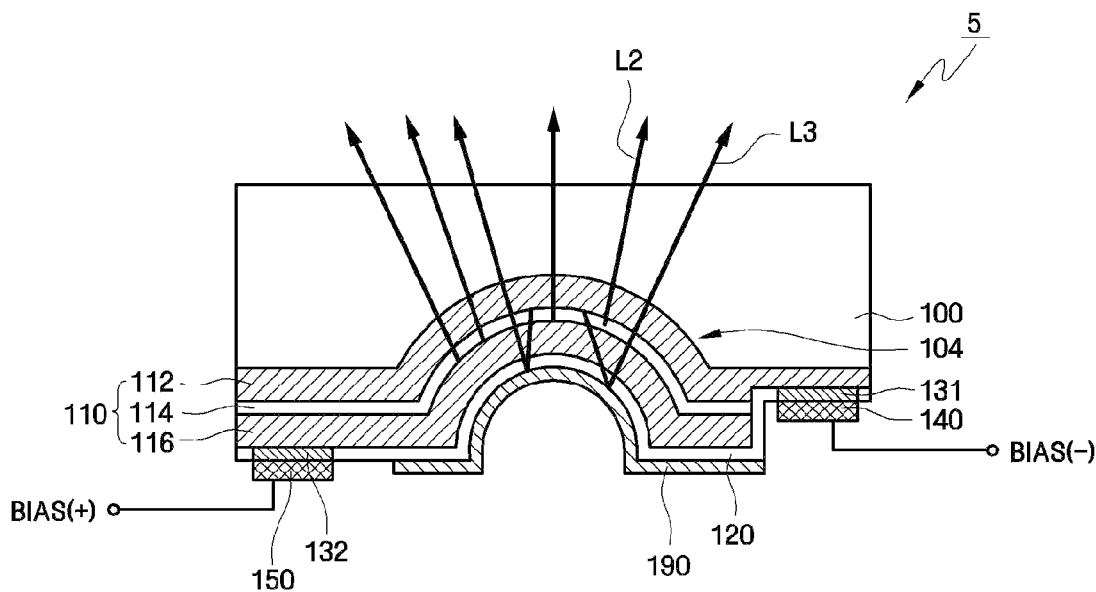
FIG. 8 is a view for explaining a fifth exemplary embodiment of a light-emitting element according to aspects of the present invention.

FIG. 7 is a view for explaining a fourth exemplary embodiment of a light-emitting element 4 according to aspects of the present invention. FIG. 8 is a view for explaining a fifth exemplary embodiment of a light-emitting element 5 according to aspects of the present invention. The light-emitting element 4 according to the fourth exemplary embodiment is of the lateral type, and the light-emitting element 5 according to the fifth exemplary embodiment is of the flip-chip type.

Referring to FIG. 7, a dome pattern 104 used in the light-emitting element 4 according to the fourth exemplary embodiment may be of a concave dome type or an inverted dome type. A light-emitting structure 110 is conformally formed along the dome pattern 104.

When the light-emitting structure 110 is conformally formed along the dome pattern 104, and thus curved, a large portion of light generated within the light-emitting structure 110 is nearly perpendicular (within a few degrees either way) to a surface of the light-emitting structure 110. Thus, most of the light generated within the light-emitting structure 110 can come out of the light-emitting structure 110, thereby improving light extraction efficiency.

Although not shown in the drawing, the light-emitting element 4 may include a plurality of dome patterns 104_1 through 104_n (where n≧2) (similar to FIGS. 4 and 5). The light-emitting structure 110 may be conformally formed along the dome patterns 104_1 through 104_n (n≧2).

Referring to FIG. 8, the light-emitting element 5 according to the fifth exemplary embodiment is different from the light-emitting element 4 according to the fourth exemplary embodiment in that it further includes a reflective layer 190 conformally formed above a second conductive layer 116 of a light-emitting structure 110. From among light L2 and L3 generated within the light-emitting structure 110, the light L2 comes directly out of the light-emitting structure 110 toward a substrate 100, and the light L3 is reflected by the reflective layer 190 and then comes out of the light-emitting structure 110 toward the substrate 100.

In FIG. 8, an insulating layer 120 is formed on the second conductive layer 116, and the reflective layer 190 is formed on the insulating layer 190. However, the present invention is not limited to this arrangement. For example, the second conductive layer 116 may be formed directly on the reflective layer 190 without having the insulating layer 120 interposed between the two.

Figure 9:
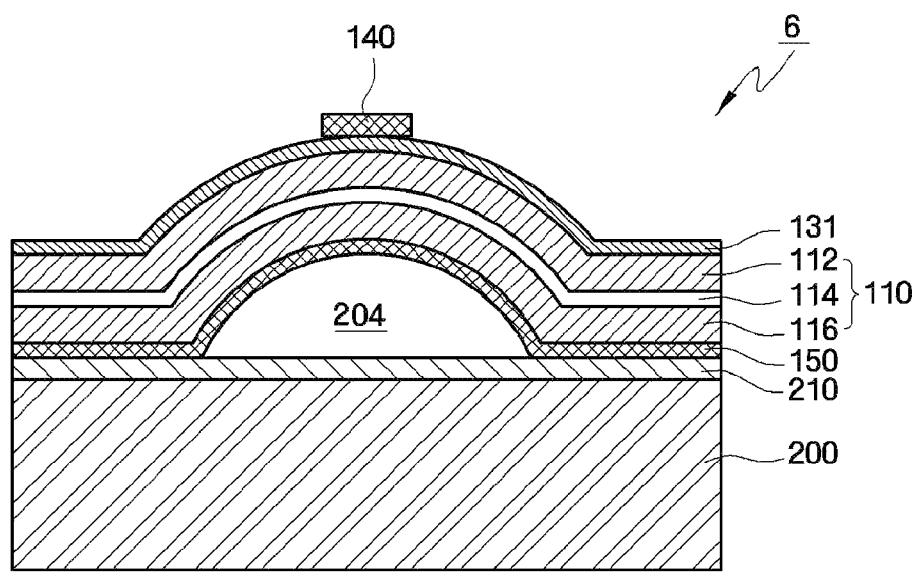
FIG. 9 is a view for explaining a sixth exemplary embodiment of a light-emitting element according to aspects of the present invention.
Figure 10:
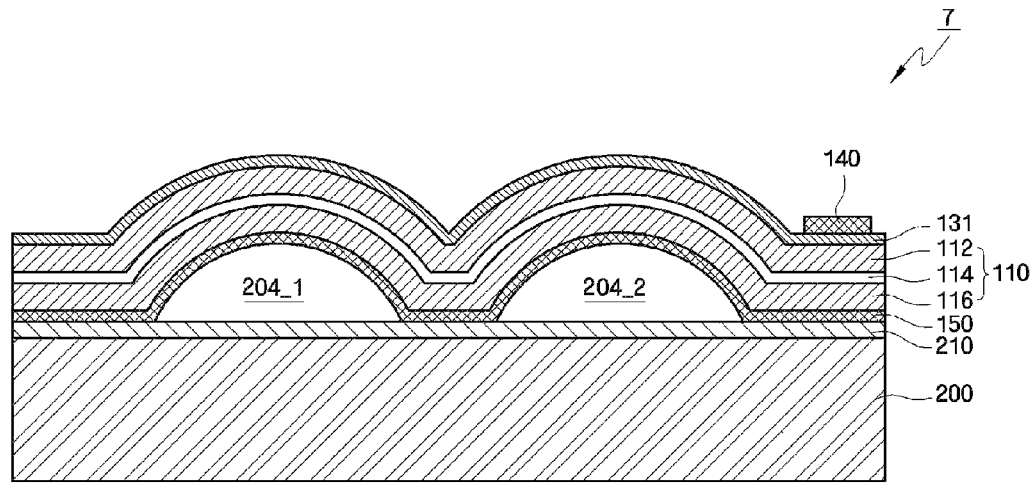
FIG. 10 is a view for explaining a seventh exemplary embodiment of a light-emitting element according to aspects of the present invention.

FIG. 9 is a view for explaining a sixth exemplary embodiment of a light-emitting element 6 according to aspects of the present invention. FIG. 10 is a view for explaining a seventh exemplary embodiment of a light-emitting element 7 according to aspects of the present invention. The light-emitting elements 6 and 7 according to the sixth and seventh exemplary embodiments are of a vertical type.

Referring to FIG. 9, the light-emitting element 6 according to the sixth exemplary embodiment includes a light-emitting structure 110, a first electrode 140, and a second electrode 150. The light-emitting structure 110 includes a first conductive layer 112 of a first conductivity type, a light-emitting layer 114, and a second conductive layer 116 of a second conductivity type, which are sequentially stacked on a substrate 200. The first electrode 140 is electrically connected to the first conductive layer 112, and the second electrode 150 is electrically connected to the second conductive layer 116. In particular, since the light-emitting structure 110 is arch-shaped, a vacant space 204 is formed between the light-emitting structure 110 and the substrate 200. Thus, light generated within the light-emitting structure 110 can easily come out of the light-emitting structure 110 without being trapped in the light-emitting structure 110.

The substrate 200 may be a conductive substrate made of one of Si, strained Si, Si alloy, Si—Al, silicon-on-insulator (SOI), SiC, silicon germanium (SiGe), silicon germanium carbide (SiGeC), germanium (Ge), Ge alloy, gallium arsenide (GaAs), indium arsenide (InAs), III-V semiconductor, and II-VI semiconductor, as examples. In order to reduce resistance, the substrate 200 and the second conductive layer 116 may be doped with impurities of the same type.

In FIG. 9, the first electrode 140 is formed on a protruding (convex) portion of the arch-shaped light-emitting structure 110. However, the present invention is not limited to this arrangement. For example, the first electrode 140 may be formed at a position on the light-emitting structure 110 that does not obstruct an optical path, for example, at both ends (i.e., flat portions) of the arch-shaped light-emitting structure 110. The first electrode could also be formed at a different position on the convex portion of the arch-shaped light-emitting structure 110. The first electrode 140 may include at least one of ITO, Cu, Ni, Cr, Au, Ti, Pt, Al, V, W, Mo and Ag, as examples.

A first ohmic layer 131 may be formed between the first electrode 140 and the first conductive layer 112 and may be conformally formed along the first conductive layer 112. The first ohmic layer 131 can reduce resistance when electric current flows from the first electrode 140 to the first conductive layer 112. Thus, the first ohmic layer 131 can reduce current crowding and improve current spreading. Consequently, the efficiency of light emitted from the light-emitting structure 110 can be improved.

The second electrode 150 may be disposed between the substrate 200 and the light-emitting structure 110. As shown in the drawing, the second electrode 150 may be conformally formed along the second conductive layer 116 of the light-emitting structure 110. Thus, the second electrode 150 may be arch-shaped. The second electrode 150 may be made of a material having high reflectivity, such as Ag or Al. The second electrode 150 is made of a material having high reflectivity in order to allow light, which is generated within the light-emitting structure 110, to come out of the light-emitting structure 110 after being reflected by the second electrode 150.

Although not shown in FIG. 9, a second ohmic layer may be formed between the second conductive layer 116 and the second electrode 150 in order to reduce resistance of electric current that flows into the second conductive layer 116 through the substrate 200. Alternatively, only the second ohmic layer may be formed instead of the second conductive layer 116.

In addition, an adhesive material layer 210 is formed between the substrate 200 and the second electrode 150 (or the second ohmic layer when the second electrode 150 is not formed). The adhesive material layer 210 is used to bond the substrate 200 to the second electrode 150 in this embodiment. The adhesive material layer 210 may be a conductive material, e.g., a metal layer. The metal layer may include at least one of Au, Ag, Pt, Ni, Cu, Sn, Al, Pb, Cr, and Ti, as examples. That is, the metal layer may be a monolayer made of one of Au, Ag, Pt, Ni, Cu, Sn, Al, Pb, Cr and Ti, a stack of the same, or a combination of the same. For example, the metal layer may be an Au layer (a monolayer), an Au—Sn layer (a double layer), or a multi-layer having Au and Sn alternately stacked several times. The adhesive material layer 210 may be made of a material having lower reflectivity than that of the second electrode 150 (or the second ohmic layer when the second electrode 150 is not formed).

In FIG. 9, the adhesive material layer 210 is formed on the substrate 200. However, the present invention is not limited to this arrangement. For example, the adhesive material layer 210 may be conformally formed on the second electrode 150 (or the second ohmic layer when the second electrode 150 is not formed).

Although not shown in the drawing, a barrier layer may be formed between the second electrode 150 (or the second ohmic layer when the second electrode 150 is not formed) and the adhesive material layer 210. The barrier layer prevents the second electrode 150 (or the second ohmic layer when the second electrode 150 is not formed), which reflects light, from being damaged. The barrier layer may be a monolayer made of one of Pt, Ni, Cu, Al, Cr, Ti and W, a stack of the same, or a combination of the same. For example, the barrier layer may be a multi-layer having TiW and Pt alternately stacked a plurality of times.

Referring to FIG. 10, a light-emitting structure 110 used in the light-emitting element 7 according to the seventh exemplary embodiment may be shaped like a plurality of arches that are connected to each other. Therefore, a plurality of vacant spaces 204_1 and 204_2 are formed between the light-emitting structure 110 and a substrate 200. Although not shown in FIG. 10, a plurality of vacant spaces 204_1 through 204_$n$ ($n \geq 2$) may be formed. A first electrode 140 may be formed at a position on the light-emitting structure 110 that does not obstruct an optical path, for example, at an end (i.e., a flat portion) of the arch-shaped light-emitting structure 110.

Hereinafter, a light-emitting device fabricated by using one of the light-emitting elements 1 through 7 will be described in detail. For simplicity, a light-emitting device using the light-emitting element 6 according to the sixth exemplary embodiment is shown in the drawings. However, the scope of the present invention is not limited thereto. It will be apparent to those of ordinary skill in the art to which the present invention pertains, having had the benefit of this disclosure, can implement a light-emitting device using any one of the light-emitting elements 1 through 5 and 7 in a manner similar to that described in FIGS. 11-36 for fabricating a light-emitting device using the light-emitting element 6.

Figure 11:
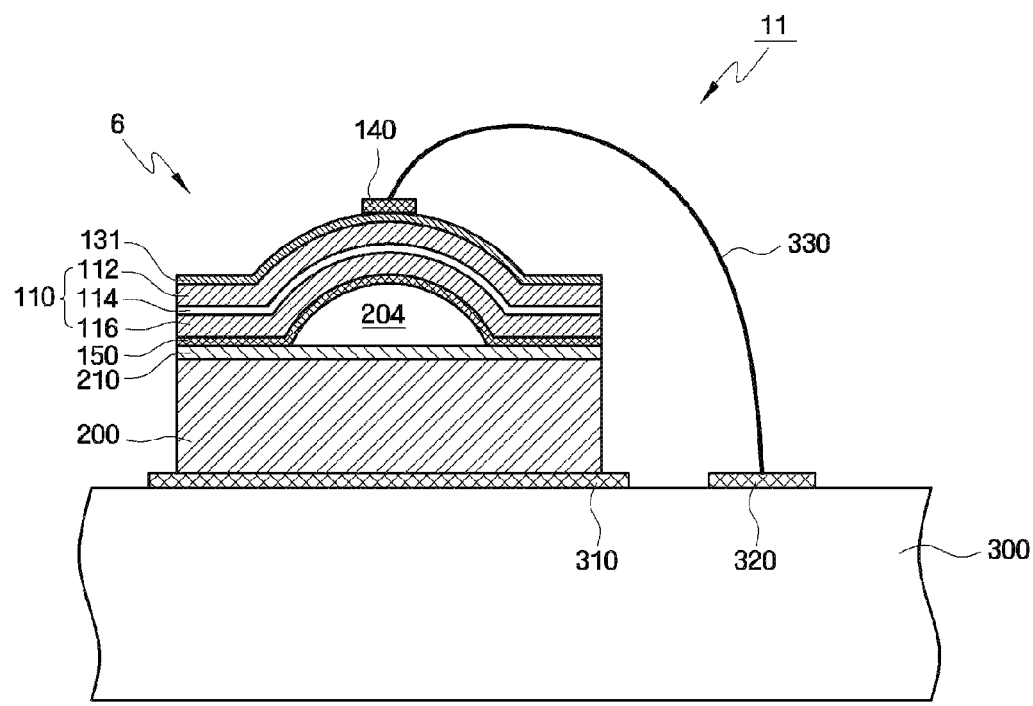
FIGS. 11 and 12 are views for explaining a first exemplary embodiment of a light-emitting device according to aspects of the present invention.
Figure 12:
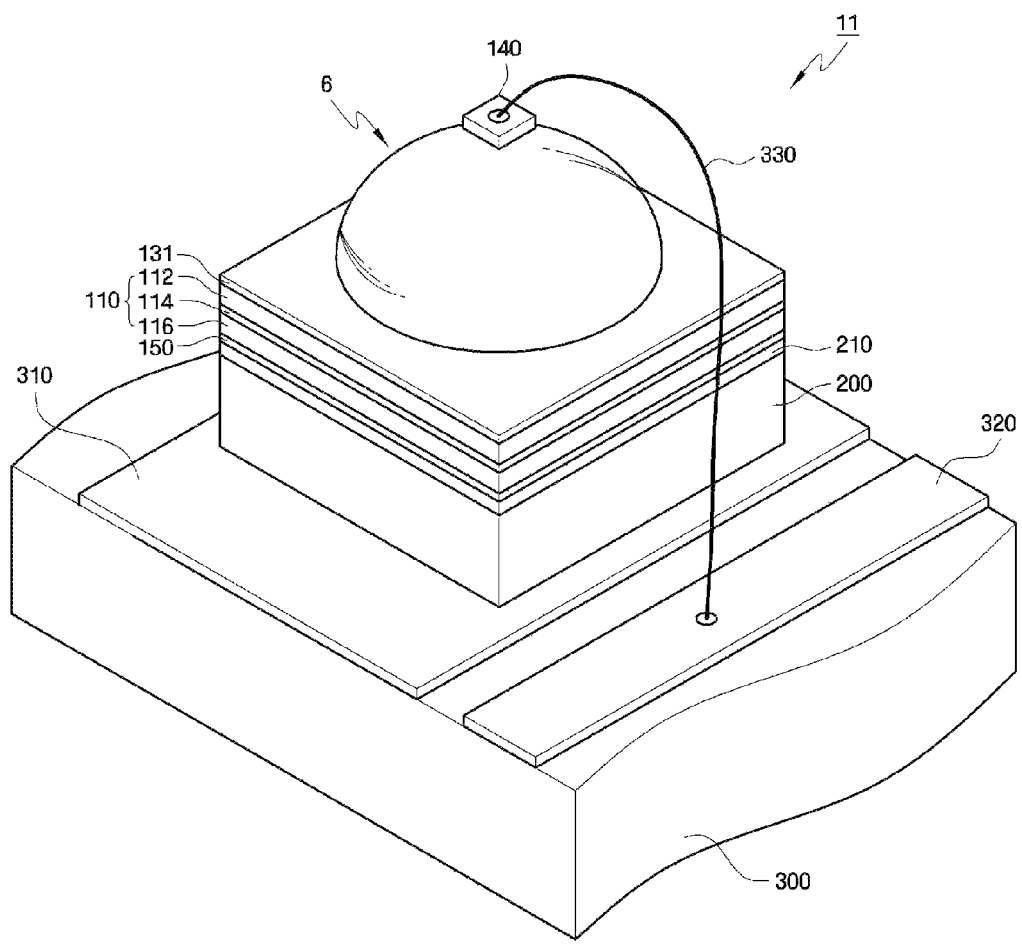

FIGS. 11 and 12 are views for explaining a first exemplary embodiment of a light-emitting device 11 according to aspects of the present invention. Referring to FIGS. 11 and 12, the light-emitting device 11 according to the first exemplary embodiment includes a circuit board 300 and the light-emitting element 6 according to the sixth exemplary embodiment, which is disposed on the circuit board 300.

The circuit board 300 includes first wiring 310 and second wiring 320, which are electrically insulated from each other. The first wiring 310 and the second wiring 320 are disposed on a surface of the circuit board 300.

The first wiring 310 is electrically connected to the substrate 200 (i.e., the second electrode 150) of the light-emitting element 6, and the second wiring 320 is electrically connected to the first electrode 140 of the light-emitting element 6. The second wiring 320 may be connected to the first electrode 140 by a wire 330. That is, the second wiring 320 may be wire-bonded to the first electrode 140. Since the substrate 200 is a conductive substrate, the first wiring 310 can be connected to the substrate 200 without requiring a wire, in this embodiment.

Figure 13:
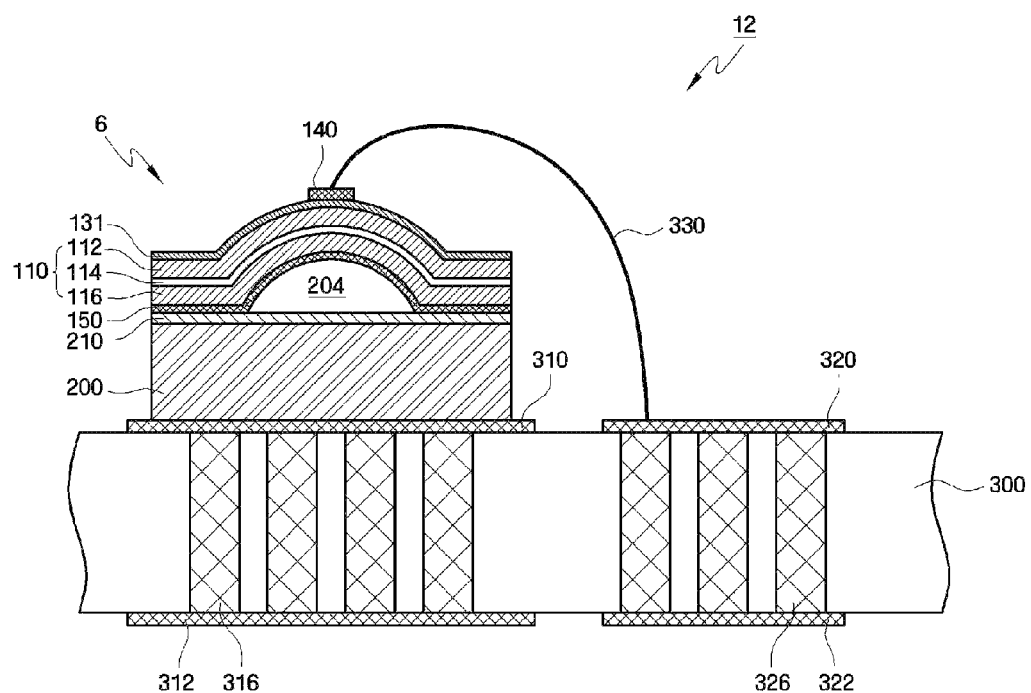
FIG. 13 is a view for explaining a second exemplary embodiment of a light-emitting device according to aspects of the present invention.

FIG. 13 is a view for explaining a second exemplary embodiment of a light-emitting device 12 according to aspects of the present invention. Referring to FIG. 13, the light-emitting device 12 according to the second exemplary embodiment is different from the light-emitting device 11 according to the first exemplary embodiment in that a circuit board 300 includes first and second through vias 316 and 326.

Specifically, first wiring 310 and second wiring 320 are formed on a surface of the circuit board 300 and are electrically insulated from each other. In addition, third wiring 312 and fourth wiring 322 are formed on the other surface of the circuit board 300 and are electrically insulated from each other. The first wiring 310 is connected to the third wiring 312 by the first through vias 316, and the second wiring 320 is connected to the fourth wiring 322 by the second through vias 326.

Figure 14:
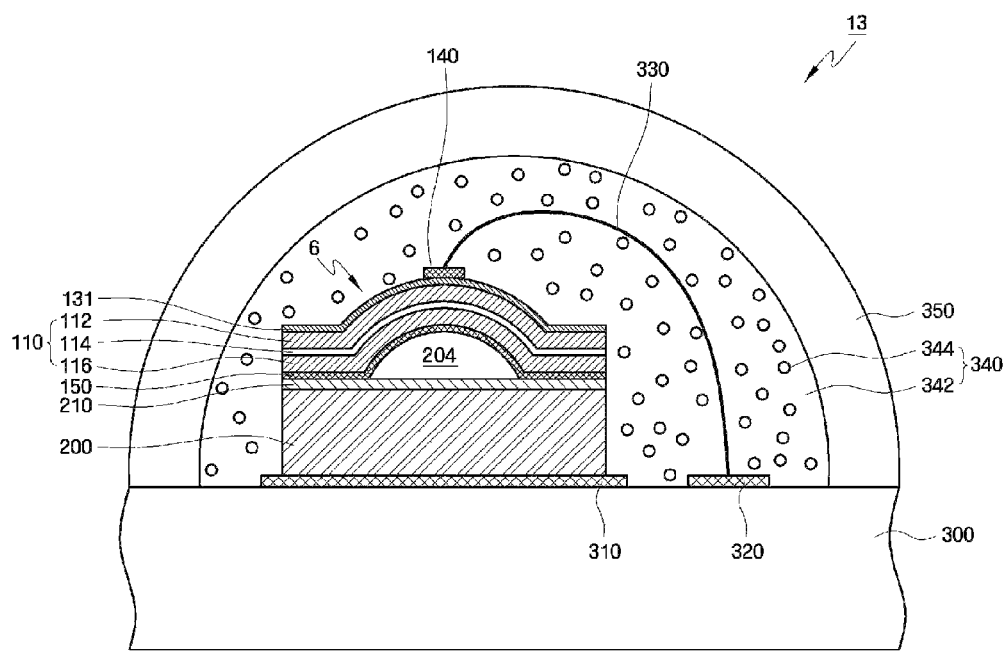
FIG. 14 is a view for explaining a third exemplary embodiment of a light-emitting device according to aspects of the present invention.

FIG. 14 is a view for explaining a third exemplary embodiment of a light-emitting device 13 according to aspects of the present invention. Referring to FIG. 14, the light-emitting device 13 according to the third exemplary embodiment is different from the light-emitting device 11 according to the first exemplary embodiment in that it includes a phosphor layer 340 that surrounds the light-emitting element 6 according to the sixth exemplary embodiment and second transparent resin 350 that surrounds the phosphor layer 340.

The phosphor layer 340 may be a mixture of first transparent resin 342 and phosphors 344. The phosphors 344 dispersed within the phosphor layer 340 absorb light emitted from the light-emitting element 6 and convert the wavelength of the light. Thus, as the phosphors 344 are dispersed more evenly, the light-emitting properties of the light-emitting device 13 can be improved. When the phosphors 344 are dispersed more evenly, they can better convert the wavelength of light and produce a better color mixture. As shown in the drawing, the phosphor layer 340 may be formed higher than a wire 330 in order to protect the wire 330, i.e., such that the wire 330 is encased by the phosphor layer 340.

For example, the light-emitting device 13 may include the phosphor layer 340 in order to produce white color, in one embodiment. When the light-emitting element 6 emits light having a blue wavelength, the phosphors 344 may include yellow phosphors. In order to increase a color-rending index (CRI), the phosphors 344 may also include red phosphors. Alternatively, when the light-emitting element 6 emits light having an ultraviolet (UV) wavelength, the phosphors 344 may include all of red, green, and blue phosphors.

The first transparent resin 342 may be any material that can disperse the phosphors 344 in a stable manner. For example, the first transparent resin 342 may be epoxy resin, silicon resin, hard silicon resin, denatured silicon resin, urethane resin, oxetane resin, acrylic resin, polycarbonate resin, or polyimide resin.

The phosphors 344 may be any material that can absorb light from the light-emitting structure 110 and convert the wavelength of the absorbed light. For example, the phosphors 344 may be at least one of nitride-based or oxynitride-based phosphors activated mainly by a lanthanoid element such as europium (Eu) or cerium (Ce); alkaline earth halogen apatite phosphors activated mainly by a lanthanoid element such as Eu or a transition metal element such as manganese (Mn); alkaline earth metal halogen borate phosphors; alkaline earth metal aluminate phosphors; alkaline earth silicate phosphors; alkaline earth sulfide phosphors; alkaline earth thiogallate phosphors; alkaline earth silicon nitride phosphors; germanate phosphors; rare earth aluminate phosphors activated mainly by a lanthanoid element such as Ce; rare earth silicate phosphors; and organic or organic complex phosphors activated mainly by a lanthanoid element such as Eu. Specifically, phosphors listed below may be used. However, the phosphors 344 are not limited to the following phosphors.

Examples of nitride-based phosphors activated mainly by a lanthanoid element such as Eu or Ce include $M_2Si_5N_8$:Eu (where M is at least one of Sr, Ca, Ba, Mg and Zn), $MSi_7N_{10}$:Eu, $M_{1.8}Si_5O_{0.2}N_8$:Eu, and $M_{0.9}Si_7O_{0.1}N_{10}$:Eu (where M is at least one of Sr, Ca, Ba, Mg and Zn).

Examples of oxynitride-based phosphors activated mainly by a lanthanoid element such as Eu or Ce include $MSi_2O_2N_2$:Eu (where M is at least one of Sr, Ca, Ba, Mg and Zn).

Examples of alkaline earth halogen apatite phosphors activated mainly by a lanthanoid element such as Eu or a transition metal element such as Mn include $M_5(PO_4)_3X$:R (where M is at least one of Sr, Ca, Ba, Mg and Zn, X is at least one of F, Cl, Br and I, and R is at least one of Eu and Mn.

Examples of alkaline earth metal halogen borate phosphors include $M_2B_5O_9X$:R (where M is at least one of Sr, Ca, Ba, Mg and Zn, X is at least one of F, Cl, Br and I, and R is at least one of Eu and Mn.

Examples of alkaline earth metal aluminate phosphors include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (where R is at least one of Eu and Mn.

Examples of alkaline earth sulfide phosphors include $La_2O_2S$:Eu, $Y_2O_2S$:Eu, and $Gd_2O_2S$:Eu.

Examples of rare earth aluminate phosphors activated mainly by a lanthanoid element such as Ce include YAG phosphors represented by compositional formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y,Gd)_3(A1,Ga)_5O_{12}$. Other examples include phosphors such as $Tb_3Al_5O_{12}$:Ce and $Lu_3Al_5O_{12}$:Ce in which part or all of Y has been replaced by Tb, Lu, or the like.

Rare earth silicate phosphors contain silicate, and major examples of the rare earth silicate phosphors include $(SrBa)_2SiO_4$:Eu.

Examples of other phosphors include ZnS:Eu, $Zn_2GeO_4$:Mn, and $MGa_2S_4$:Eu (where M is at least one of Sr, Ca, Ba, Mg and Zn, and X is at least one of F, Cl, Br, and I).

The above phosphors may also include at least one of Tb, Cu, Ag, Au, Cr, Nd, Dy, Co, Ni and Ti, instead of or in addition to Eu. Furthermore, other phosphors that offer similar performance and effects to the phosphors listed above can also be used.

The second transparent resin 350 is lens-shaped and diffuses light emitted from the light-emitting element 6. The curvature and flatness of the second transparent resin 350 may be adjusted to control the light diffusion/extraction properties of the second transparent resin 350. The second transparent resin 350 surrounds the phosphor layer 340 to protect the phosphor layer 340. That is, the second transparent resin 350 surrounds the phosphor layer 340 because the properties of the phosphor layer 340 may deteriorate when contacting, for example, moisture.

The second transparent resin 350 may be any material through which light can pass, including semi-transparent materials. For example, the second transparent resin 350 may be epoxy resin, silicon resin, hard silicon resin, denatured silicon resin, urethane resin, oxetane resin, acrylic resin, polycarbonate resin, or polyimide resin.

Figure 15:
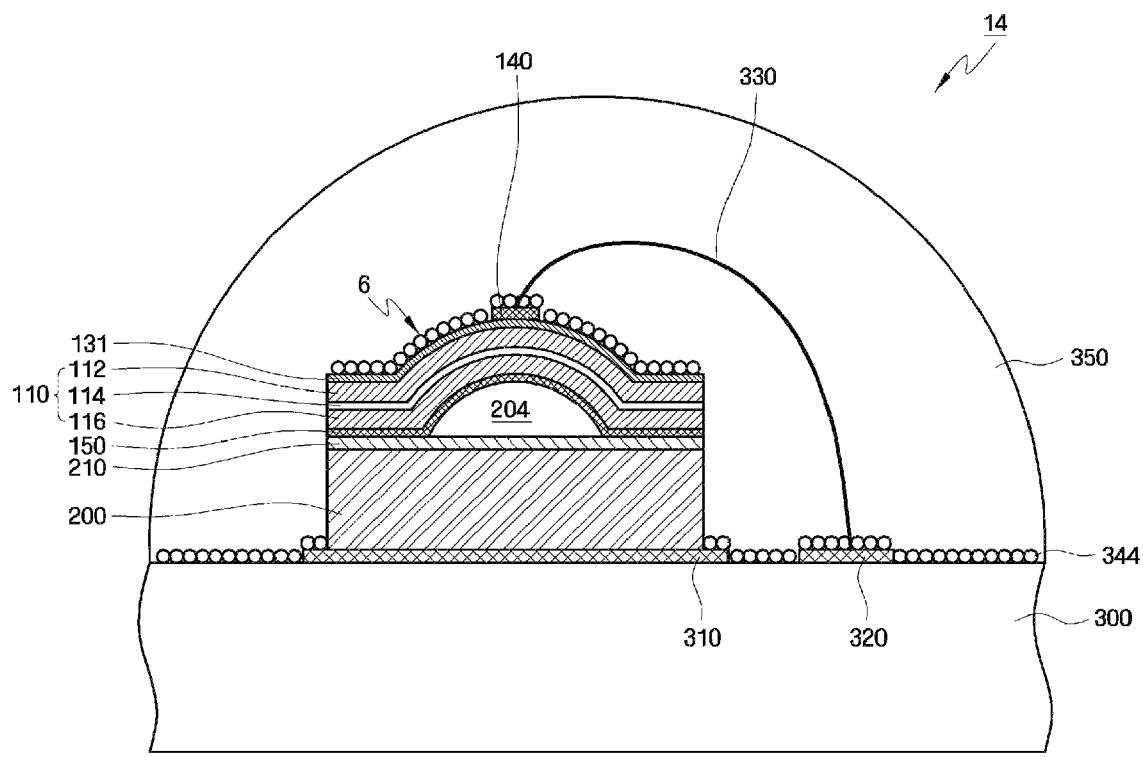
FIG. 15 is a view for explaining a fourth exemplary embodiment of a light-emitting device according to aspects of the present invention.

FIG. 15 is a view for explaining a fourth exemplary embodiment of a light-emitting device 14 according to aspects of the present invention. Referring to FIG. 15, phosphors 344 are formed along the profile of the light-emitting element 6 according to the sixth exemplary embodiment and that of a circuit board 300. Here, the phosphors 344 may be coated on the light-emitting element 6 and the circuit board 300 without requiring first transparent resin (indicated by reference numeral 342 in FIG. 14).

If the phosphors 344 are coated on the light-emitting element 6 and the circuit board 300 without requiring the first transparent resin, the light-emitting element 6 is surrounded by a monolayer 350 of transparent resin.

Figure 16:
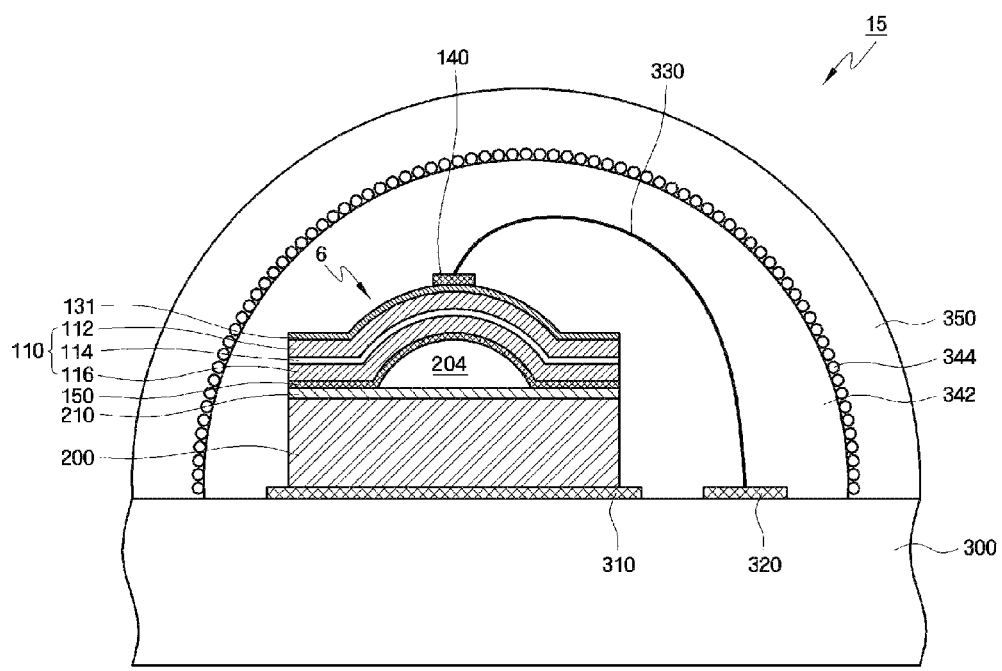
FIG. 16 is a view for explaining a fifth exemplary embodiment of a light-emitting device according to aspects of the present invention.

FIG. 16 is a view for explaining a fifth exemplary embodiment of a light-emitting device 15 according to aspects of the present invention. Referring to FIG. 16, the light-emitting device 15 according to the fifth exemplary embodiment is different from the light-emitting device 13 according to the third exemplary embodiment in that it includes first transparent resin 342 which surrounds the light-emitting element 6 according to the sixth exemplary embodiment, phosphors 344 formed on the first transparent resin 342 and second transparent resin 350 formed on the phosphors 344. That is, since the first transparent resin 342 and the phosphors 344 are coated separately without being mixed with each other, the phosphors 344 may be formed thinly and conformally on a surface of the first transparent resin 342.

Figure 17:
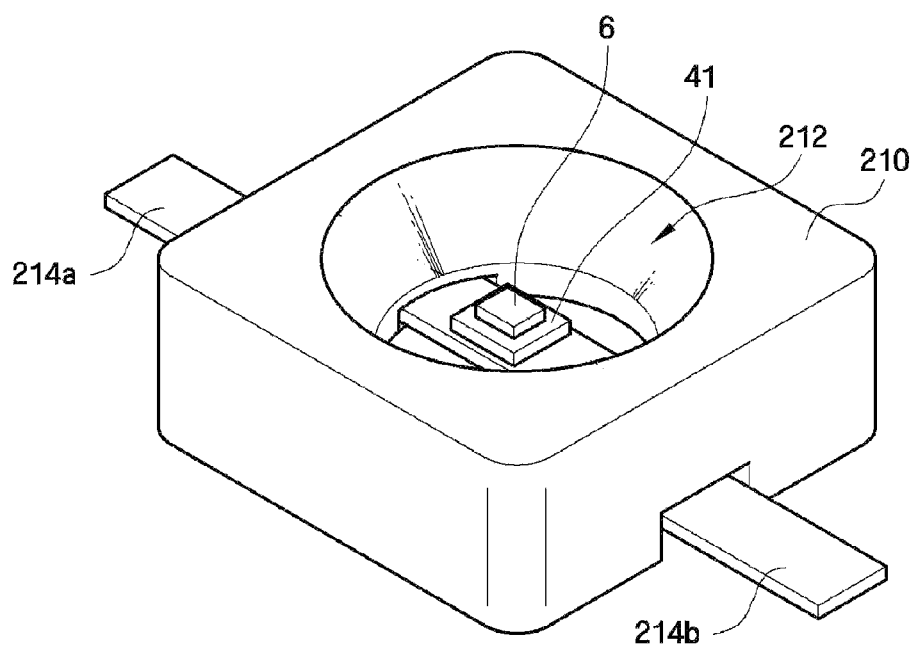
FIG. 17 is a view for explaining a sixth exemplary embodiment of a light-emitting device according to aspects of the present invention.

FIG. 17 is a view for explaining a light-emitting device according to a sixth exemplary embodiment of the present invention. The light-emitting device shown in FIG. 17 is a top view-type light-emitting package. However, the present invention is not limited thereto.

Referring to FIG. 17, a sub-mount 41 on which the light-emitting element 6 according to the sixth exemplary embodiment is mounted is disposed on a package body 210. Specifically, a opening 212 is formed in the package body 210, and the sub-mount 41 having the light-emitting element 6 mounted thereon is disposed in the opening 212. The opening 212 may have inclined sidewalls. Thus, light emitted from the light-emitting element 6 may be reflected by the sidewalls and then proceed forward. The size of the opening 212 may be determined in consideration of the degree to which light generated by the light-emitting element 6 is reflected by the sidewalls of the opening 212, the angle at which the light is reflected by the sidewalls of the opening 212, the type of transparent resin that fills the opening 212, the type of phosphors, and the like. The sub-mount 41 may be placed in the center of the opening 212 since chromatic non-uniformity can be easily prevented when the light-emitting element 6 is equidistant from the sidewalls of the opening 212.

The package body 210 may be made of an excellent lightfast organic material, such as silicon resin, epoxy resin, acrylic resin, urea resin, fluorine resin or imide resin, or may be made of an excellent lightfast inorganic material, such as glass or silica gel. In addition, thermosetting resin may be used in order to prevent the package body 210 from melting due to heat while the light-emitting device is fabricated. Various fillers, such as aluminum nitride, aluminum oxide and compounds of the same, may be added to resin in order to relieve thermal stress of the resin. The package body 210 may also be made of a material other than resin. For example, part (e.g., the sidewalls) or all of the package body 210 may be made of a metal material or a ceramic material. When all of the package body 210 is made of a metal material, heat generated by the light-emitting element 6 can easily dissipate out of the package body 210.

Leads 214a and 214b are formed in the package body 210 and are electrically connected to the light-emitting element 6. The light-emitting element 6 may be electrically connected to the sub-mount 41, and the sub-mount 41 may be electrically connected to the leads 214a and 214b by vias. The leads 214a and 214b may be made of a highly thermally conductive material since heat generated by the light-emitting element 6 can dissipate directly out of the package body 210 through the leads 214 and 214b when the leads 214a and 214b are made of a highly thermally conductive material.

Although not shown in the drawing, at least part of the opening 212 may be filled with a transparent resin layer. In addition, phosphors may be formed on the transparent resin layer. Alternatively, the transparent resin layer may be mixed with the phosphors, e.g., as discussed above.

For example, in order to produce white color phosphors may be used as follows. When the light-emitting element 6 emits light having a blue wavelength, phosphors may include yellow phosphors. In order to increase the CRI, the phosphors may also include red phosphors. Alternatively, when the light-emitting element 6 emits light having a UV wavelength, the phosphors may include all of red, green, and blue phosphors.

Figure 18:
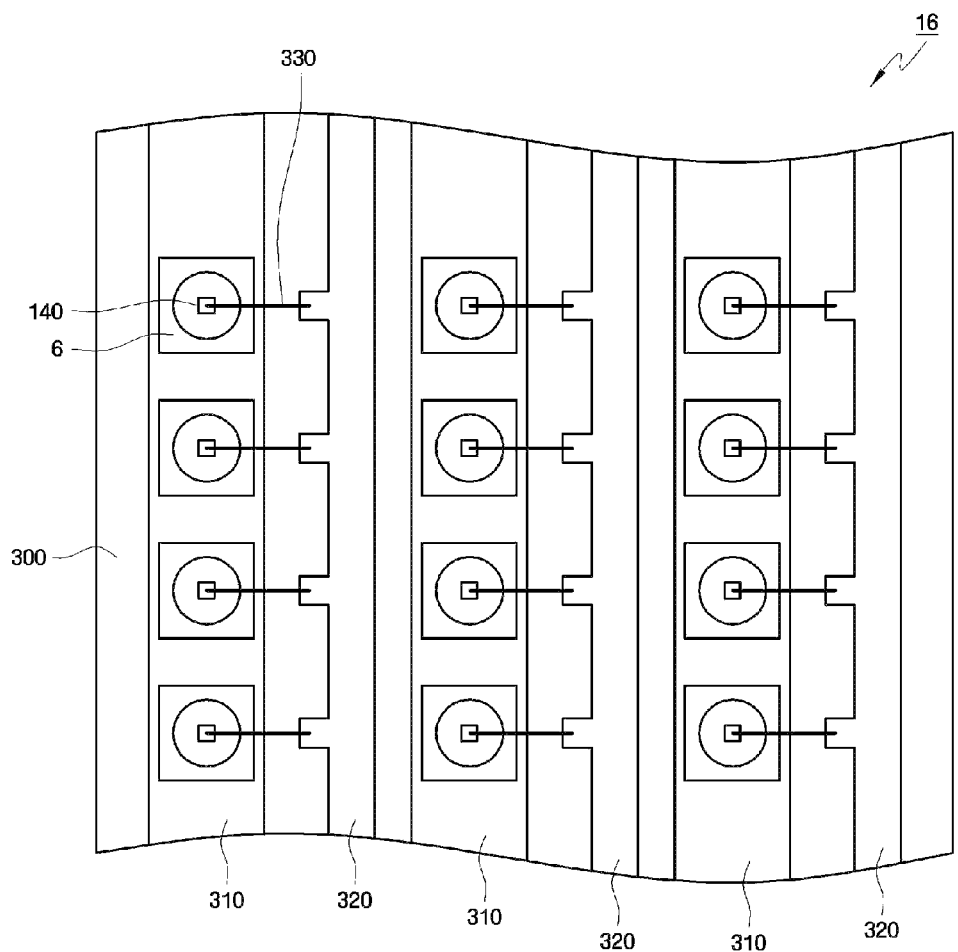
FIGS. 18 through 19B are views for explaining a seventh exemplary embodiment of a light-emitting device according to aspects of the present invention.
Figure 19A:
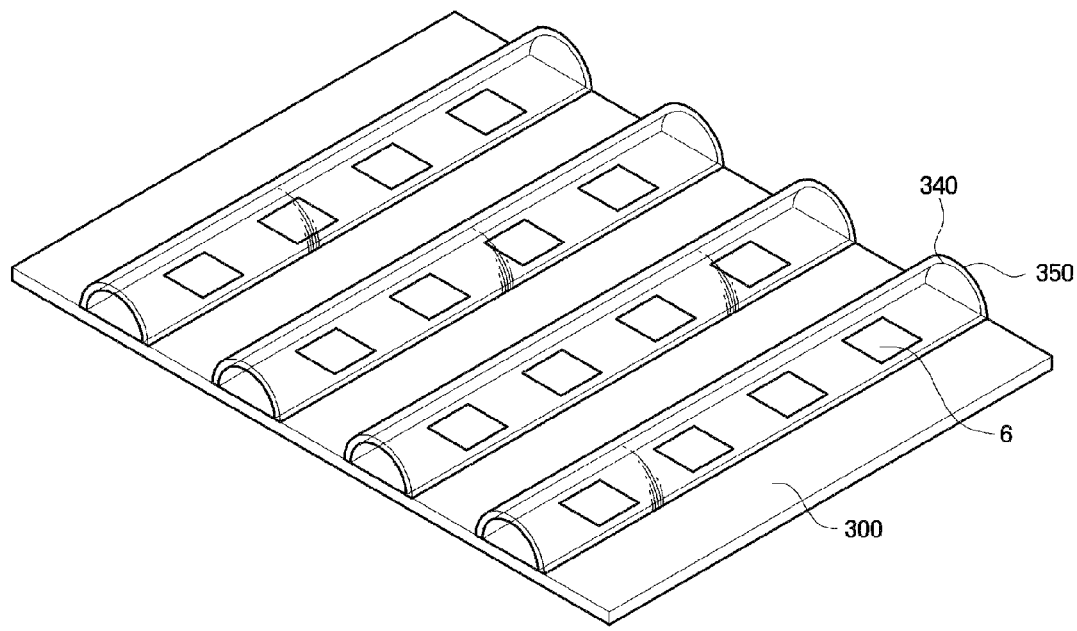
Figure 19B:
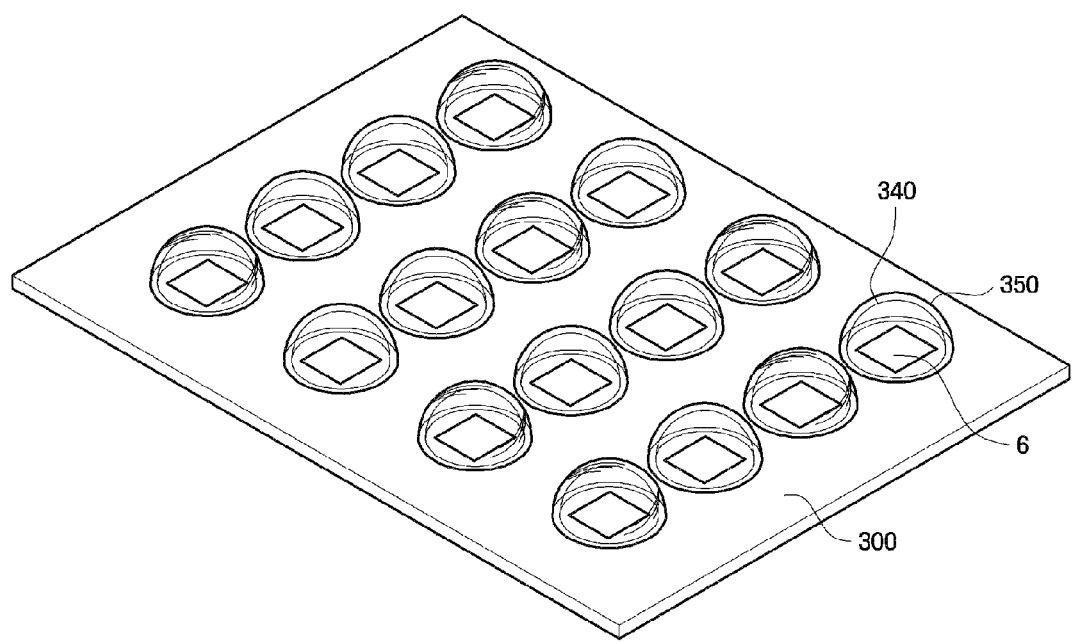

FIGS. 18 through 19B are views for explaining a seventh exemplary embodiment a light-emitting device 16 according to a sixth of the present invention. Specifically, FIGS. 18 through 19B are views for explaining an array of the light-emitting elements 6 according to the seventh exemplary embodiment, which are disposed on a circuit board 300. In particular, FIGS. 19A and 19B show phosphor layers 340 and second transparent resin 350 formed on the array of the light-emitting elements 6.

Referring to FIG. 18, first wiring 310 and second wiring 320 are formed on the circuit board 300 and extend in a direction to be parallel to each other. The light-emitting elements 6 are disposed on the first wiring 310 (and respective second electrodes 150 not shown) and arranged in a line in the direction in which the first wiring 310 extends. The first electrode 140 of each of the light-emitting elements 6 is connected to the second wiring 320 by a wire 330.

A first bias is applied to the first wiring 310, and a second bias is applied to the second wiring 320. When the light-emitting structure 110 (see FIG. 9) of each of the light-emitting elements 6 is forward-biased, each of the light-emitting elements 6 emits light.

Referring to FIG. 19A, the phosphor layers 340 and the second transparent resin 350 may be formed in a linear manner. For example, when the light-emitting elements 6 are arranged in the direction in which the first wiring 310 extends, the phosphor layers 340 and the second transparent resin 350 may also extend along the direction in which the first wiring 310 extends. In addition, the phosphors 340 and the second transparent resin 350 may completely surround the first wiring 310 and the second wiring 320.

Referring to FIG. 19B, the phosphor layers 340 and the second transparent resin 350 may be formed in a dotted manner. In this case, each of the phosphor layers 340 and each of the second transparent resin 350 may surround a corresponding one of the elements 6.

Figure 20:
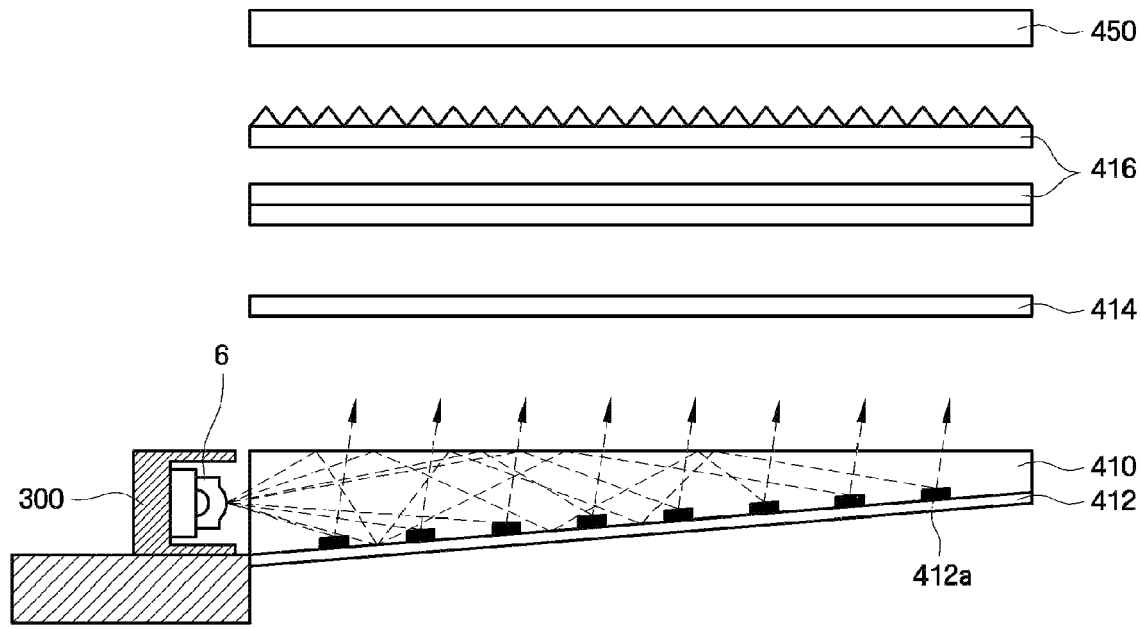
FIG. 20 is a view for explaining an eighth exemplary embodiment of a light-emitting device according to aspects of the present invention.

FIG. 20 is a view for explaining an eighth exemplary embodiment of a light-emitting device according to aspects of the present invention. The light-emitting device shown in FIG. 20 is shown as can be implemented in an end product. A light-emitting device according to aspects of the present invention can be applied to various apparatuses, such as lighting apparatuses, display apparatuses, and mobile apparatuses (mobile phones, MP3 players, navigations, etc.).

The light-emitting device shown in FIG. 20 is an edge-type backlight unit (BLU) used in a liquid crystal display (LCD). Since LCDs are not self-luminous, they use a BLU as their light source. Generally, a BLU is disposed behind a liquid crystal panel and provides light to the liquid crystal panel.

Referring to FIG. 20, the BLU includes the light-emitting element 6 according to the sixth exemplary embodiment, a light guide plate 410, a reflective plate 412, a diffusion sheet 414, and a pair of prism sheets 416. The light-emitting element 6 provides light and may be of a side-view type.

The light guide plate 410 guides light toward a liquid crystal panel 450. The light guide plate 410 is a panel made of a transparent plastic material, such as acryl, and guides light emitted from the light-emitting device toward the liquid crystal panel 450, which is disposed above the light guide plate 410. Thus, various patterns 412a are printed at the back of the light guide plate 410 to guide light, which is input to the light guide plate 410, toward the liquid crystal panel 450.

The reflective plate 412 is disposed on a lower surface of the light guide plate 410 and thus reflects light, which is emitted downward from the light guide plate 410, upward. That is, the reflective plate 412 reflects light, which is not reflected by the various patterns 412a printed at the back of the light guide plate 410, toward an output surface of the light guide plate 410. In so doing, the reflective plate 412 reduces light loss and improves the uniformity of light that is output from the output surface of the light guide plate 410.

The diffusion sheet 414 diffuses light output from the light guide plate 410, thereby preventing the light from being concentrated in a specific area.

Each of the prism sheets 416 has a predetermined array of triangular prisms on an upper surface thereof. The prism sheets 416 typically include two sheets, and an array of triangular prisms of one of the two prism sheets 416 crosses an array of triangular prisms of the other one of the two prism sheets 416 at a predetermined angle so that light diffused by the diffusion sheet 414 can proceed in a direction perpendicular to the liquid crystal panel 450.

Figure 21:
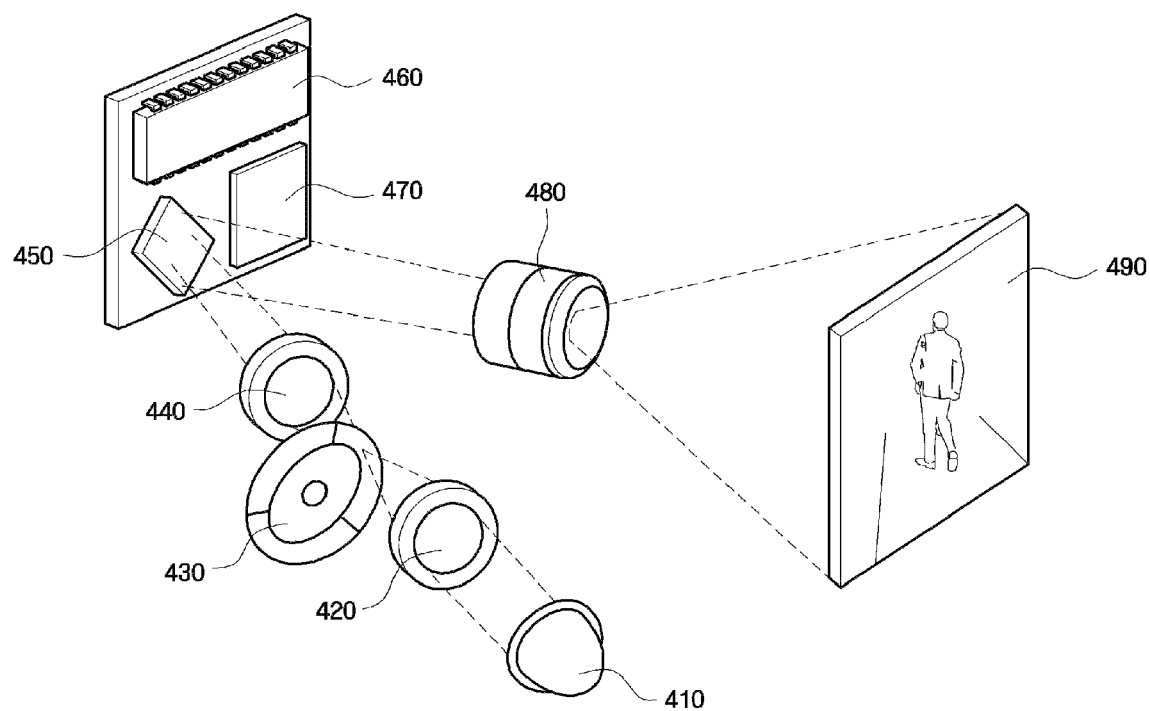
FIGS. 21 through 24 are views for explaining ninth through twelfth exemplary embodiments of light-emitting devices according to aspects of the present invention.
Figure 22:
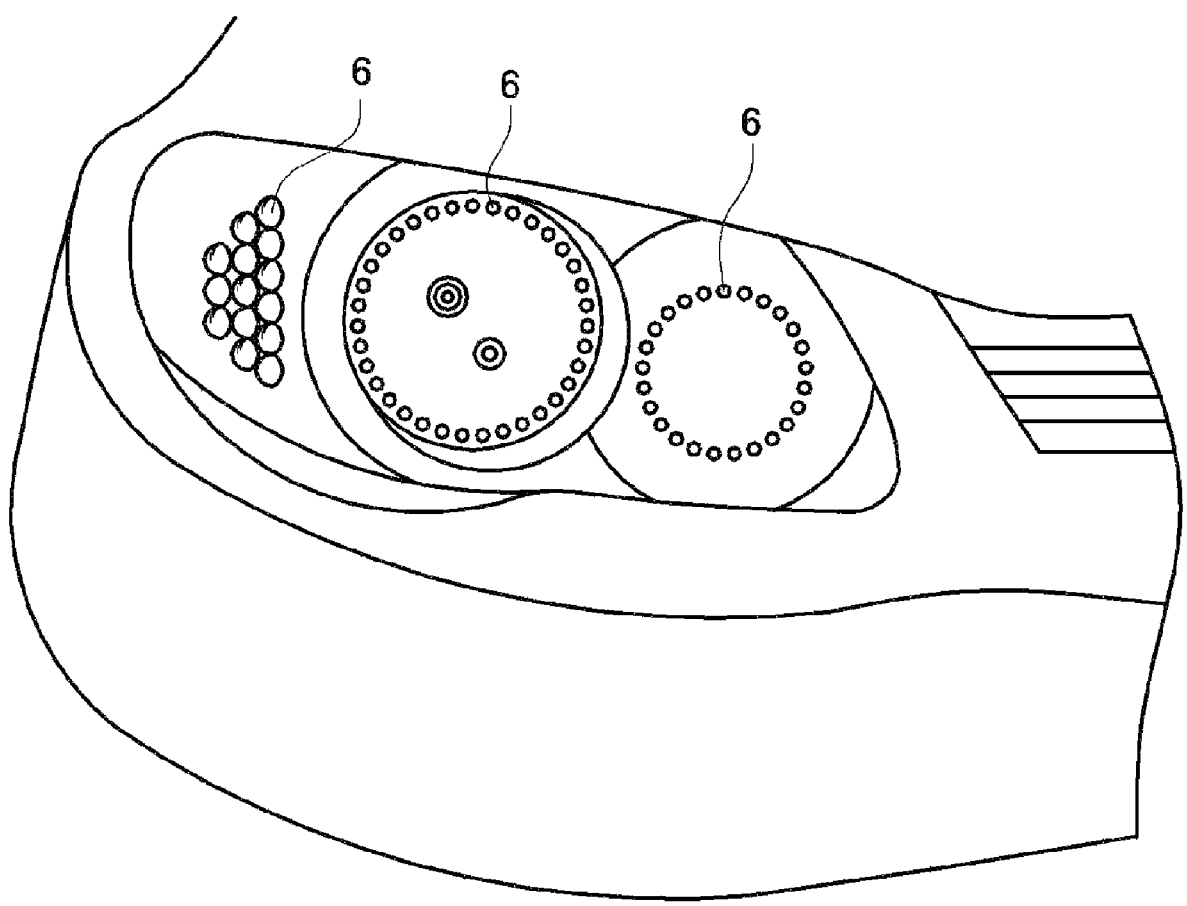
Figure 23:
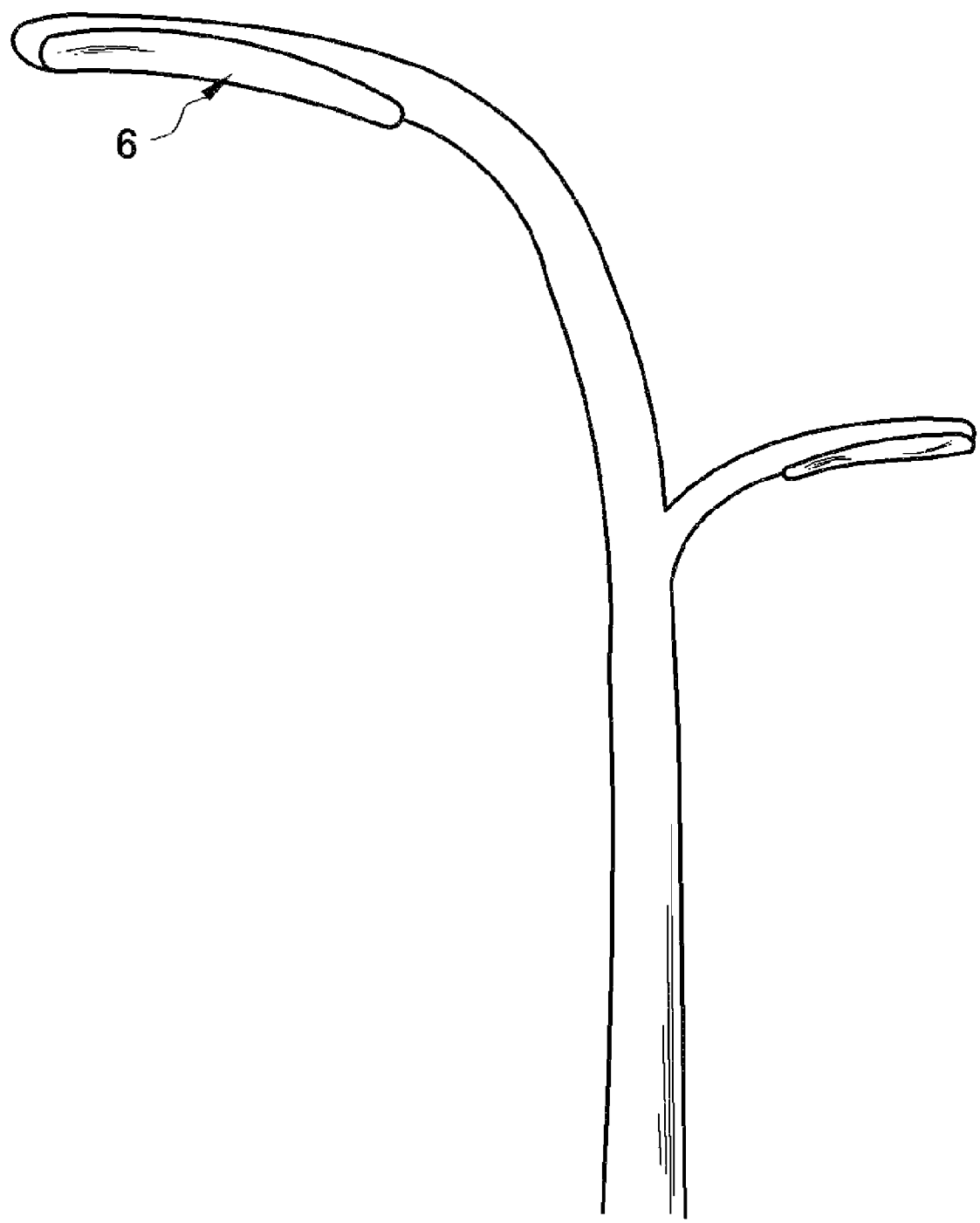
Figure 24:
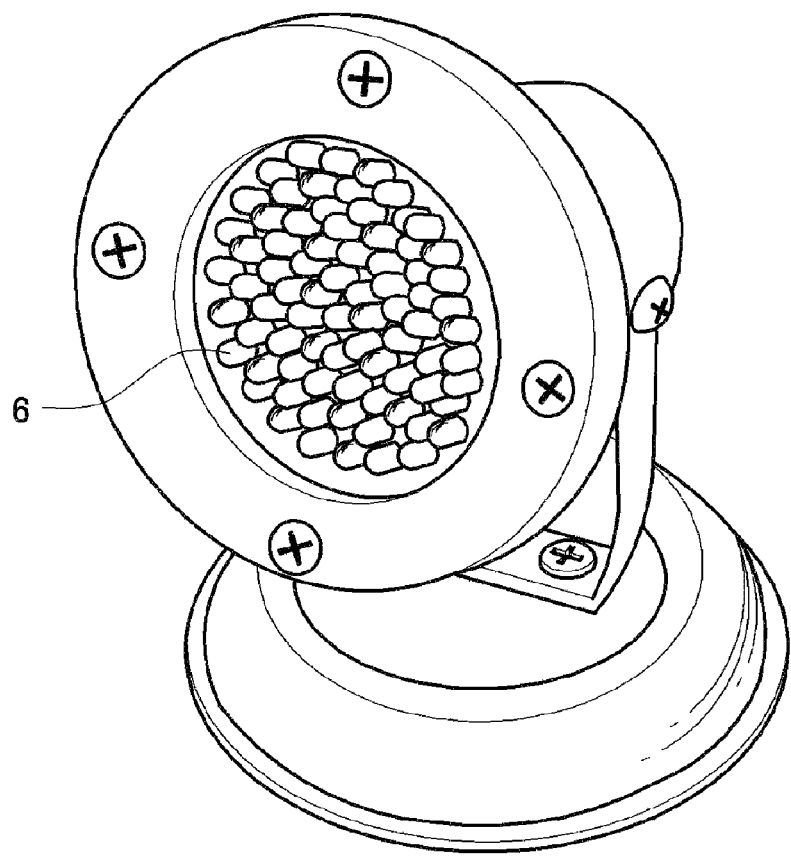

FIGS. 21 through 24 are views for explaining ninth through twelfth exemplary embodiments of light-emitting devices according to aspects of the present invention. FIGS. 21 through 24 show exemplary end products to which the light-emitting devices according to the eighth through eleventh exemplary embodiments can be applied. Specifically, FIG. 21 shows a projector, FIG. 22 shows a headlight assembly of a vehicle, FIG. 23 shows a streetlight, and FIG. 24 shows a lamp—as examples. The light-emitting element 6 used in FIGS. 21 through 24 may be of the top-view type.

Referring to the projector of FIG. 21, light emitted from a light source 410 passes through a condensing lens 420, a color filter 430, and a sharpening lens 440. Then, the light is reflected by a digital micro-mirror device 450 and passes through a projection lens 480 to reach a screen 490. A light-emitting element according to the present invention is included in the light source 410.

Referring to the vehicle headlight assembly of FIG. 22, each of three different lights in the head light assembly, e.g., headlight, high beam, and directional, includes a different pattern of light-emitting elements 6.

Referring to the streetlight of FIG. 23, the light-emitting element 6 is used as the light source. Referring to the lamp of FIG. 24, a plurality of the light-emitting elements 6 are used as a collective light source.

Figure 25:
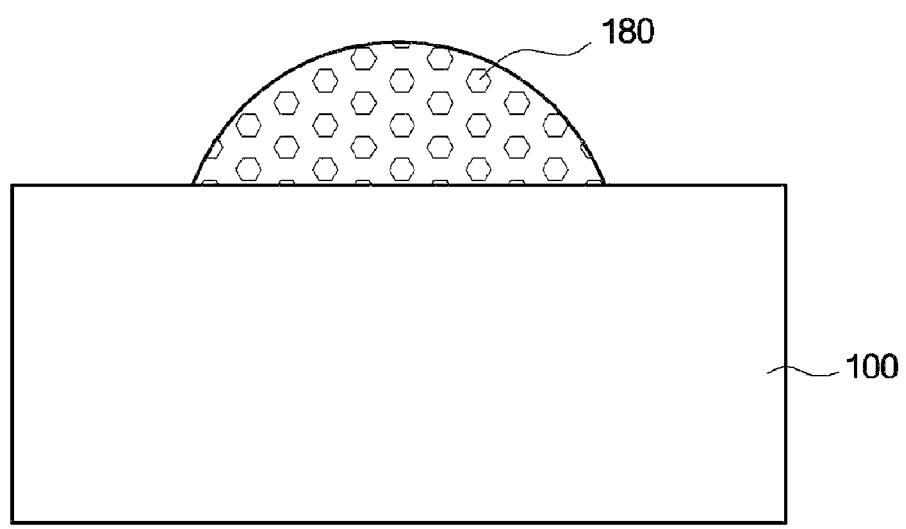
FIGS. 25 through 28 are views for explaining processes included in an exemplary embodiment of a method of fabricating the light-emitting element according to the first exemplary embodiment.

FIGS. 25 through 28 are views for explaining processes included in an exemplary embodiment of a method of fabricating the light-emitting element 1 (see FIG. 1) according to aspects of the present invention. Referring to FIG. 25, a convex dome-shaped mask pattern 180 is formed on the substrate 100.

Specifically, a cylindrical mask layer is formed on the substrate 100, and the substrate 100 having the mask layer is heat-treated at a high temperature to form the convex dome-shaped mask pattern 180. Here, the convex dome-shaped mask pattern 180 may be, for example, photoresist.

Figure 26:
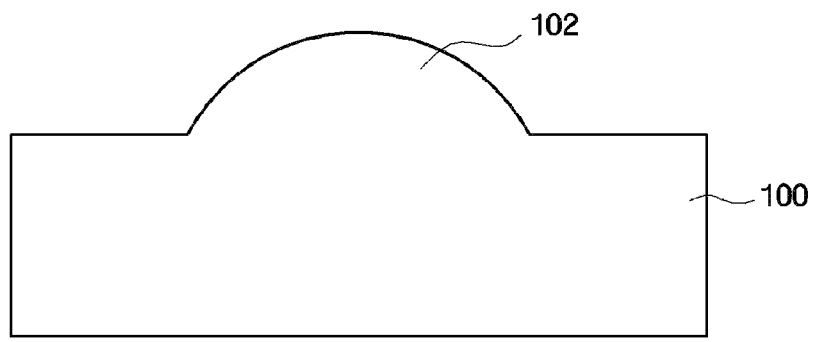

Referring to FIG. 26, the substrate 100 is etched by using the convex dome-shaped mask pattern 180 to form the dome pattern 102 on the substrate 100.

Figure 27:
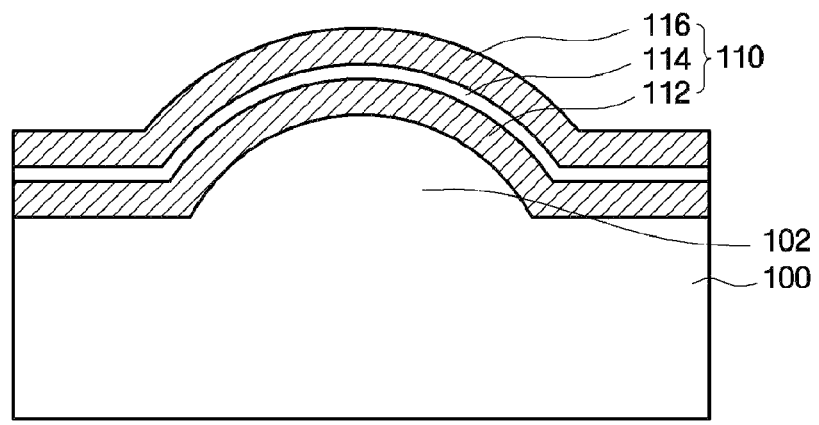

Referring to FIG. 27, the first conductive layer 112 of the first conductivity type, the light-emitting layer 114, and the second conductive layer 116 of the second conductivity type are formed on the substrate 100 having the dome pattern 102.

Specifically, each of the first conductive layer 112, the light-emitting layer 114, and the second conductive layer 116 may include $In_xAl_yGa_{(1-x-y)}N$ ($0 \leq x \leq 1$, $0 \leq y \leq 1$). For example, each of the first conductive layer 112, the light-emitting layer 114, and the second conductive layer 116 may be AlGaN or InGaN.

The first conductive layer 112 of the first conductivity type, the light-emitting layer 114, and the second conductive layer 116 of the second conductivity type may be grown by metal organic chemical vapor deposition (MOCVD), liquid phase epitaxy, hydride vapor phase epitaxy, molecular beam epitaxy, metal organic vapor phase epitaxy (MOVPE), or the like.

Figure 28:
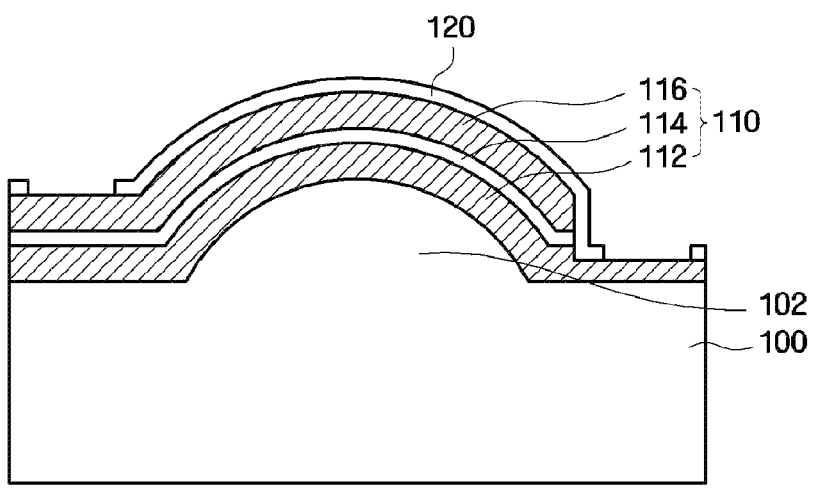

Referring to FIG. 28, the second conductive layer 116, the light-emitting layer 114, and the first conductive layer 112 are patterned. As a result, the first conductive layer 112 may have a protruding portion (that is, the first conductive layer 112 may extend further than the second conductive layer 116 and/or the light-emitting layer 114).

Next, the insulating layer 120 is formed on the light-emitting structure 110, which includes the second conductive layer 116, the light-emitting layer 114, and the first conductive layer 112. Then, the insulating layer 120 is patterned to expose a portion of the first conductive layer 112 and a portion of the second conductive layer 116.

Referring back to FIG. 2, the first ohmic layer 131 and the first electrode 140 are formed on the portion of the first conductive layer 112 exposed by the insulating layer 120, and the second ohmic layer 132 and the second electrode 150 are formed on the portion of the second conductive layer 116 exposed by the insulating layer 120. As a result, the light-emitting element 1 according to the first exemplary embodiment is completed, as shown in FIG. 2.

FIGS. 29 through 32 are views for explaining processes included in an exemplary embodiment of a method of fabricating the light-emitting element 4 (see FIG. 7) according to the fourth exemplary embodiment.

Figure 29:
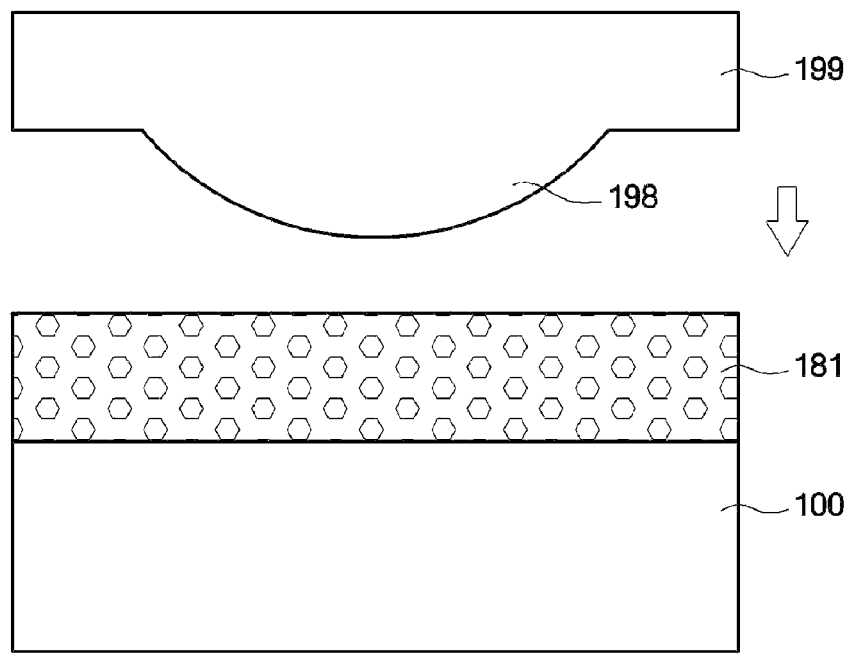
FIGS. 29 through 32 are views for explaining processes included in an exemplary embodiment of a method of fabricating the light-emitting element according to the fourth exemplary embodiment.

Referring to FIG. 29, a mask layer 181 is formed on the substrate 100. The mask layer 181 may be, for example, photoresist. Then, a concave dome pattern 182 is formed in the mask layer 181 by using a tool 199 having a convex dome pattern 198.

Specifically, as shown in FIG. 29, the mask layer 181 is pressed with the tool 199 having the convex dome pattern 198. Since the mask layer 181 is pressed with the tool 199 having the convex dome pattern 198, the concave dome pattern 182 is formed in the mask layer 181.

Figure 30:
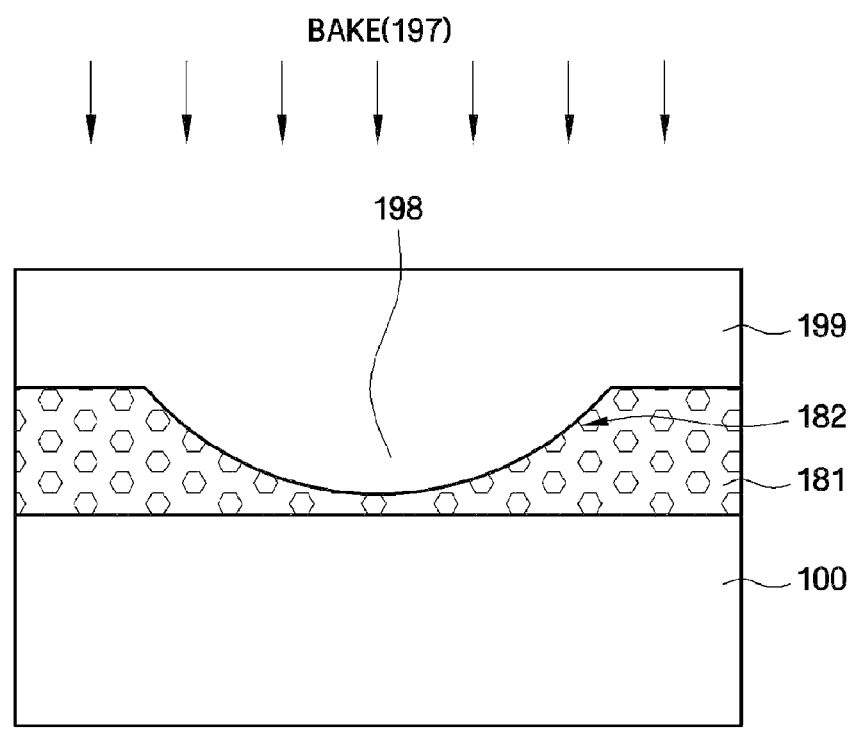

Referring to FIG. 30, a baking process 197 is performed on the substrate 100 having the mask layer 181 to harden the mask layer 181 having the concave dome pattern 182. When necessary, the baking process 197 may be omitted.

Figure 31:
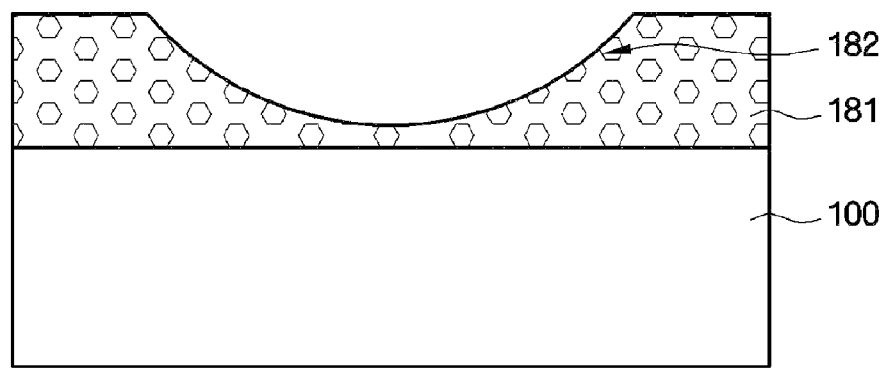

Referring to FIG. 31, the tool 199 having the convex dome pattern 198 is separated from the mask layer 181.

Figure 32:
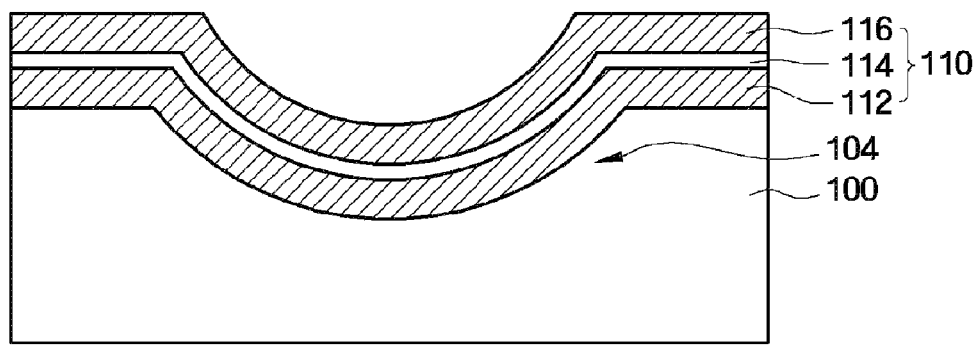
Figure 33:
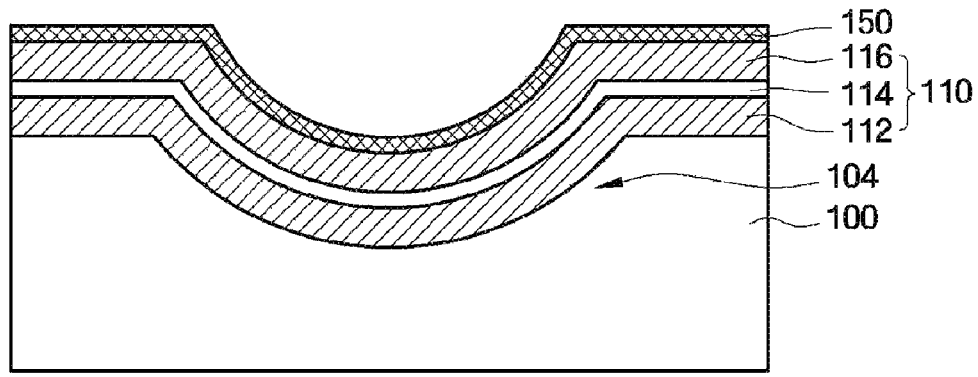
FIGS. 33 through 36 are views for explaining processes included in an exemplary embodiment of a method of fabricating the light-emitting element according to the sixth exemplary embodiment.

Referring to FIG. 32, the substrate 100 is etched by using the mask layer 181 having the concave dome pattern 182. As a result, the concave dome pattern 104 is formed in the substrate 100.

Next, the first conductive layer 112 of the first conductivity type, the light-emitting layer 114, and the second conductive layer 116 of the second conductivity type are formed on the substrate 100 having the concave dome pattern 104.

Referring back to FIG. 7, the second conductive layer 116, the light-emitting layer 114, and the first conductive layer 112 are patterned. As a result, the first conductive layer 112 may have a protruding portion (that is, the first conductive layer 112 may extend further than the second conductive layer 116 and/or the light-emitting layer 114).

Next, the insulating layer 120 is formed on the light-emitting structure 110, which includes the second conductive layer 116, the light-emitting layer 114, and the first conductive layer 112. Then, the insulating layer 120 is patterned to expose a portion of the first conductive layer 112 and a portion of the second conductive layer 116.

The first ohmic layer 131 and the first electrode 140 are formed on the portion of the first conductive layer 112 exposed by the insulating layer 120, and the second ohmic layer 132 and the second electrode 150 are formed on the portion of the second conductive layer 116 exposed by the insulating layer 120. As a result, the light-emitting element 4 according to the fourth exemplary embodiment is completed, as shown in FIG. 7.

FIGS. 33 through 36 are views for explaining processes included in an exemplary embodiment of a method of fabricating the light-emitting element 6 (see FIG. 9) according to the sixth exemplary embodiment. The light-emitting element 6 according to the sixth exemplary embodiment may be fabricated in the processes described above with reference to FIGS. 29 through 32 and processes subsequent to the above processes.

The concave dome pattern 104 is formed in each of a plurality of substrates 100 (see FIGS. 29 through 31). Each of the substrates 100 may be an insulating substrate made of $Al_2O_3$ or ZnO or may be a conductive substrate made of Si or SiC, as examples.

The light-emitting structure 110, which includes the first conductive layer 112 of the first conductivity type, the light-emitting layer 114 and the second conductive layer 116 of the second conductivity type, is conformally formed along the concave dome pattern 104 of each of the substrates 100 (see FIG. 32).

Referring to FIG. 32, the second ohmic layer is conformally formed along the second conductive layer 116, and the second electrode 150 is formed on the second ohmic layer. Alternatively, the second electrode 150 may not be formed, and only the second ohmic layer may be formed along the second conductive layer 116.

Figure 34:
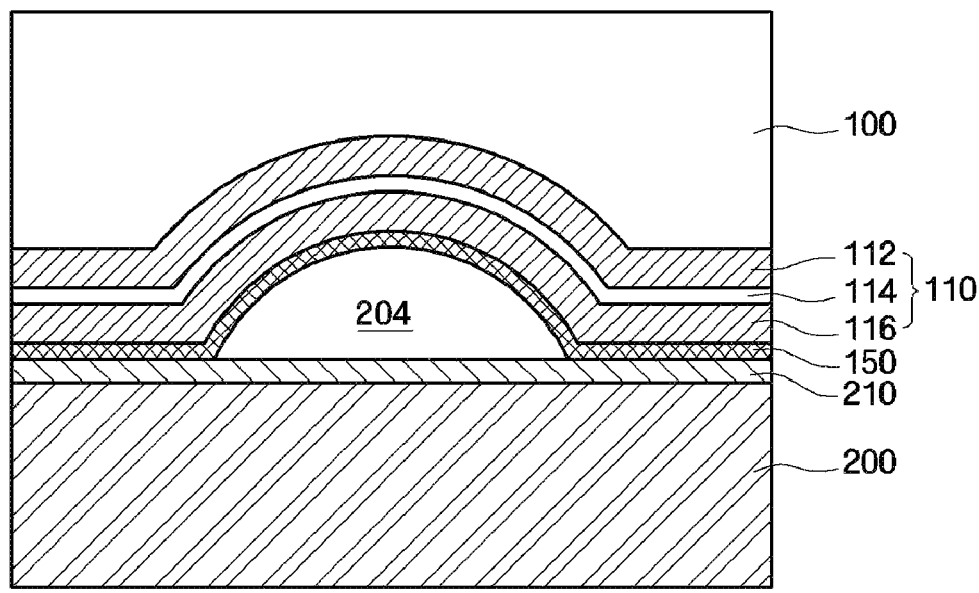
Figure 35:
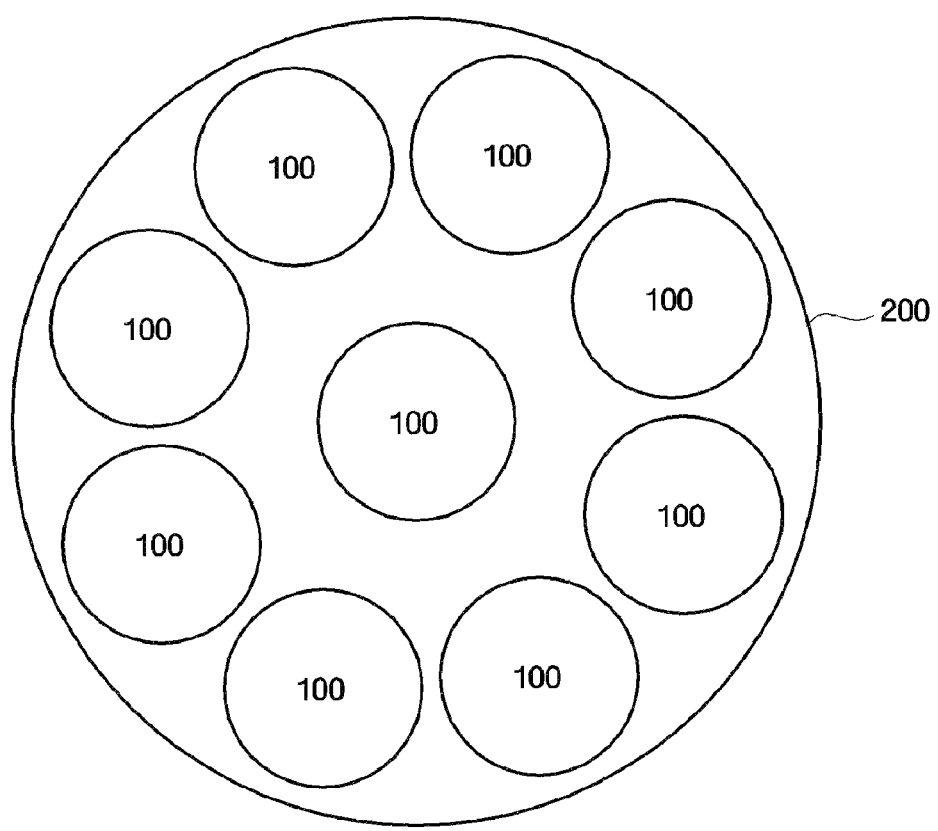

Referring to FIGS. 34 and 35, each of the substrates 100 is bonded to the substrate 200, and the second electrode 150 is interposed between the substrates 100 and 200.

Specifically, the substrate 200 may be the same size as or may be larger than each of the substrates 100. If the substrate 200 is larger than each of the substrates 100, it completely hides each of the substrates 100 when put on top of each of the substrates 100. For example, in some embodiments substrate 200 can have a larger surface area that each of substrates 100. When the substrates 100 and 200 are circular, as in FIG. 35, a diameter of the substrate 200 may be greater than that of each of the substrates 100. For example, the diameter of the substrate 200 may be 6 inches (approximately 150 mm) or greater, and that of each of the substrates 100 may be less than 6 inches. When the substrates 100 and 200 are square, a diagonal length of the substrate 200 may be greater than that of each of the substrates 100.

If the substrate 200 is larger than each of the substrates 100, the small-sized substrates 100 may be bonded to the large-sized substrate 200. In this case, a fabrication facility suitable for the large-sized substrate 200 can be used. Thus, no additional fabrication facility suitable for the small-sized substrates 100 is required. Furthermore, since the substrates 100 can be fabricated simultaneously, throughput can be increased, which, in turn, reduces the cost of the light-emitting element 6. When cost is not a concern, the substrate 200, which is almost the same size as each of the substrates 100, can be used.

The substrates 100 or the substrate 200 may be substantially flat because it is hard to bond the substrates 100 and 200 together when the substrates 100 or the substrate 200 are bent. As will be described later, since the adhesive material layer 210 is disposed between each of the substrates 100 and the substrate 200, it (in particular, when the adhesive material layer 210 has a sufficient thickness) can compensate for the slight bending of the substrates 100 or the substrate 200.

For example, the substrate 200 may be adhesively bonded to the substrates 100. Specifically, the substrate 200 and the substrates 100 are washed. It is desirable for bonding surfaces of the substrates 100 and 200 to be clean because various impurities (such as particles and dust) on the bonding surfaces of the substrates 200 and 100 can become sources of contamination. That is, when the substrate 200 is bonded to the substrates 100, if the above impurities exist between the substrates 200 and 100, bonding energy can be reduced. As a result, the substrates 200 and 100 can be easily separated from each other.

Next, the adhesive material layer 210 is formed on the bonding surface of the substrate 200 or the bonding surface of each of the substrates 100. For simplicity, the adhesive material layer 210 formed on the bonding surface of the substrate 200 is shown in FIG. 34. Although not shown in the drawings, after the adhesive material layer 210 is formed on an upper surface of the second electrode 150 of the light-emitting structure 110, the substrates 100 and 200 may be bonded together.

The adhesive material layer 210 may be a conductive material, e.g., a metal layer. When the adhesive material layer 210 is a metal layer, the metal layer may include at least one of Au, Ag, Pt, Ni, Cu, Sn, Al, Pb, Cr, and Ti. That is, the metal layer may be a monolayer made of one of Au, Ag, Pt, Ni, Cu, Sn, Al, Pb, Cr and Ti, a stack of the same, or a combination of the same. For example, the metal layer may be an Au layer (a monolayer), an Au—Sn layer (a double layer), or a multilayer having Au and Sn alternately stacked several times, as examples. The adhesive material layer 210 may be made of a material having lower reflectivity than that of the first electrode 140.

Next, the second electrode 150 formed on each of the substrates 100 is made to face the bonding surface of the substrate 200. For example, referring to FIG. 35, when each of the substrates 100 has a diameter of 2 inches and when the substrate 200 has a diameter of 8 inches, the nine substrates 100 shown may be disposed on the substrate 200.

Next, the substrates 200 and 100 are heat-treated and thus bonded together. Alternatively, while the substrates 200 and 100 are heat-treated, they may be pressed against each other and thus bonded together.

When the adhesive material layer 210 is an Au layer, the substrates 200 and 100 may be pressed against each other at a temperature of approximately 200 to 450° C. The temperature may be adjusted by those of ordinary skill in the art to which the present invention pertains.

Although not shown in the drawings, when throughput is not a concern, each of the substrates 100 may be substantially the same size as the substrate 200. That is, each of the substrates 100 may be bonded to the substrate 200 on a one-on-one basis.

Figure 36:
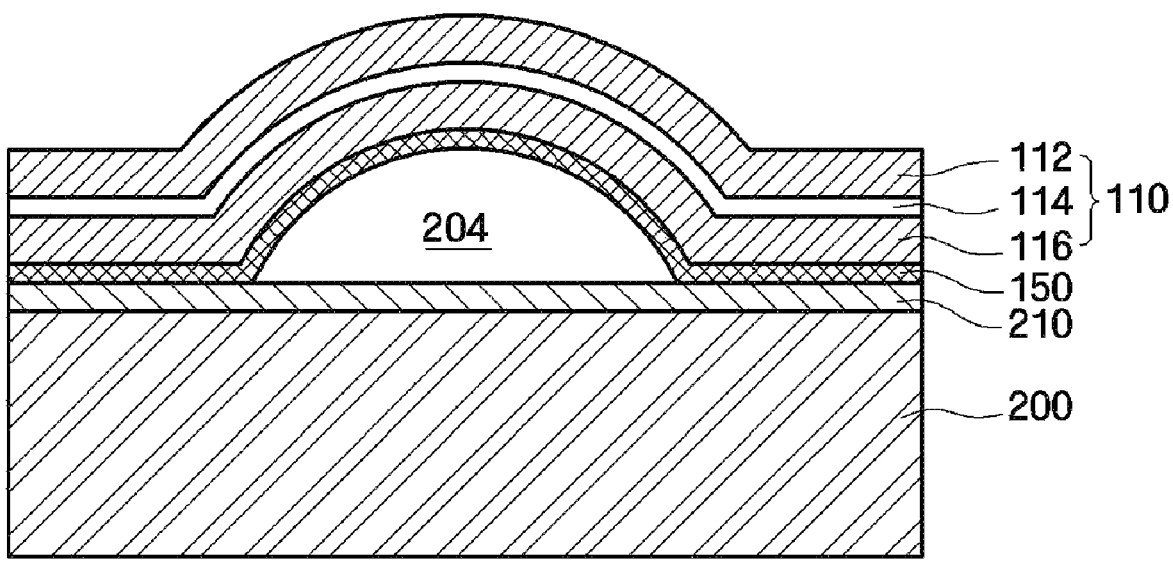

Referring to FIG. 36, the substrates 100 are removed. Here, a laser lift-off process or a chemical lift-off process may be performed.

Referring back to FIG. 9, after the substrates 100 are removed, the first ohmic layer 131 and the first electrode 140 are formed on the first conductive layer 112. The first ohmic layer 131 may be conformally formed along the first conductive layer 112.

Although not shown in the drawings, before or after the first ohmic layer 131 is formed, a surface texturing process may be performed to texture the surface of the first conductive layer 112. Specifically, the first conductive layer 112 may be wet-etched by using an etchant such as KOH and thus textured.

Next, the substrate 200 is cut in units of chips in a sawing process to complete the light-emitting elements 6.

From the above methods of fabricating the light-emitting elements 1, 4, and 6 according to the first, fourth, and sixth exemplary embodiments, those of ordinary skill in the art can easily infer methods of fabricating other light-emitting elements. Thus, the methods of fabricating other light-emitting elements are not described. Furthermore, those of ordinary skill in the art can easily infer a method of fabricating a light-emitting device using the light-emitting elements described above. Thus, a detailed description of the method of fabricating a light-emitting device is omitted.

While embodiments in accordance with the present invention have been particularly shown and described with reference to drawings thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A light-emitting element comprising:
   a substrate on which a dome pattern is formed;
   a light-emitting structure conformally formed on the dome pattern and comprises a first conductive layer of a first conductivity type, a light-emitting layer, and a second conductive layer of a second conductivity type sequentially stacked;
   an insulating layer conformally formed on the light emitting structure and patterned to expose a portion of the first conductive layer and a portion of the second conductive layer;
   a first electrode formed on a protrusion of the portion of the first conductive layer exposed by the insulating layer; and
   a second electrode formed on the portion of the second conductive layer exposed by the insulating layer.

2. The element of claim 1, wherein the dome pattern is a convex dome pattern.

3. The element of claim 1, wherein the dome pattern is a concave dome pattern.

4. The element of claim 1, further comprising a reflective layer formed on the second conductive layer.

5. A light-emitting element comprising:
   a substrate;
   a light-emitting structure that comprises a first conductive layer of a first conductivity type, a light-emitting layer, and a second conductive layer of a second conductivity type sequentially stacked on the substrate;
   a first electrode or an ohmic layer electrically connected to the first conductive layer; and
   a second electrode electrically connected to the second conductive layer,
   wherein the light-emitting structure is arched-shaped and a vacant space is formed between the light-emitting structure and the substrate.

6. The element of claim 5, wherein the substrate is a conductive substrate, and the first electrode or the ohmic layer is disposed between the conductive substrate and the light-emitting structure.

7. The element of claim 6, wherein the first electrode or the ohmic layer is conformally formed on the light-emitting structure.

8. The element of claim 6, further comprising an adhesive material layer containing a metal material and disposed between the first electrode and the substrate.

9. A light-emitting device comprising a light-emitting element, the light-emitting element comprising:

a substrate;

an arch-shaped light-emitting structure conformally formed on the substrate and comprising a first conductive layer of a first conductivity type, a light-emitting layer, and a second conductive layer of a second conductivity type sequentially stacked, wherein the light-emitting structure has a vacant space formed between the light-emitting structure and the substrate;

a first electrode electrically connected to the first conductive layer; and a second electrode electrically connected to the second conductive layer.

* * * * *